(12) United States Patent
Matsuyama et al.

(10) Patent No.: US 10,575,445 B2
(45) Date of Patent: Feb. 25, 2020

(54) MONITORING APPARATUS, MONITORING METHOD, AND PROGRAM

(71) Applicant: AZBIL CORPORATION, Chiyoda-ku (JP)

(72) Inventors: Inori Matsuyama, Chiyoda-ku (JP); Mitsuhiro Honda, Chiyoda-ku (JP)

(73) Assignee: AZBIL CORPORATION, Chiyoda-ku (JP)

( * ) Notice: Subject to any disclaimer, the term of this patent is extended or adjusted under 35 U.S.C. 154(b) by 288 days.

(21) Appl. No.: 15/689,477

(22) Filed: Aug. 29, 2017

(65) Prior Publication Data

US 2018/0063999 A1    Mar. 1, 2018

(30) Foreign Application Priority Data

Aug. 30, 2016   (JP) .................................. 2016-167694

(51) Int. Cl.
  *H05K 7/20*    (2006.01)
  *G01K 1/02*    (2006.01)
  *G08B 21/18*   (2006.01)

(52) U.S. Cl.
  CPC ......... *H05K 7/20836* (2013.01); *G01K 1/024* (2013.01); *G01K 1/026* (2013.01); *G08B 21/182* (2013.01)

(58) Field of Classification Search
  CPC ...... G01K 1/024; G01K 1/026; G08B 21/182; H05K 7/20709; H05K 7/20836
  See application file for complete search history.

(56) References Cited

U.S. PATENT DOCUMENTS 5,945,924 A  *  8/1999  Marman ................ G08B 17/10
                                                           340/928
6,967,582 B2 *  11/2005 Tice ....................... G08B 17/10
                                                           340/522
(Continued)

FOREIGN PATENT DOCUMENTS

CN      101490479 A       7/2009
JP      2005-339092 A    12/2005
KR   10-2009-0125900 A   12/2009

OTHER PUBLICATIONS

Lee, et al., "Model-based Thermal Anomaly Detection in Cloud Datacenters using Thermal Imaging", 2013 IEEE International Conference on Distributed Computing in Sensor Systems, IEEE, 2013 (accessed from <<https://ieeexplore.ieee.org/stamp/stamp.jsp?tp=&arnumber=6569425>> on Aug. 8, 2019) (Year: 2013).*

(Continued)

*Primary Examiner* — Michael J Huntley
(74) *Attorney, Agent, or Firm* — Oblon, McClelland, Maier & Neustadt, L.L.P.

(57) ABSTRACT

A monitoring apparatus includes a measured temperature acquiring unit configured to acquire, from a non-contact temperature sensor, a measured temperature on the surface of a rack housing an information and communication technology device; and an output section configured to output an alarm related to the temperature of the rack on the basis of the measured temperature acquired by the measured temperature acquiring unit. The output section does not output the alarm for a predetermined time period when the amount of change in measured temperature exceeds a threshold.

13 Claims, 18 Drawing Sheets

(56) References Cited

U.S. PATENT DOCUMENTS

| | | | |
|---|---|---|---|
| 7,126,467 B2* | 10/2006 | Albert | A61B 7/003 340/521 |
| 2005/0024826 A1* | 2/2005 | Bash | G06F 1/20 361/695 |
| 2005/0267639 A1 | 12/2005 | Sharma et al. | |
| 2011/0057803 A1* | 3/2011 | Yamaoka | H05K 7/20836 340/584 |
| 2013/0057683 A1* | 3/2013 | Chao | G01J 5/0066 348/143 |
| 2013/0169816 A1* | 7/2013 | Hu | H05K 7/1498 348/159 |
| 2015/0041550 A1* | 2/2015 | Honda | G05D 23/1932 236/51 |
| 2019/0064001 A1* | 2/2019 | Valdez | G01K 1/146 |

OTHER PUBLICATIONS

Combined Chinese Office Action and Search Report dated May 7, 2019 in Patent Application No. 201710728619.8, 9 pages (with English Translation of Category of Cited Documents).

Korean Office Action dated Jul. 30, 2018 in Korean Patent Application No. 10-2017-0103020, citing documents AO and AP therein, 4 pages.

* cited by examiner

MONITORING APPARATUS, MONITORING METHOD, AND PROGRAM

CROSS-REFERENCE TO RELATED APPLICATIONS

The present application claims the benefit of priority to Japanese Application No. 2016-167694, filed Aug. 30, 2016, the entire contents of which are incorporated herein by reference.

BACKGROUND

1. Field

The present disclosure relates to a monitoring apparatus, a monitoring method, and a program for monitoring, with one or more non-contact temperature sensors, the surface temperature of one or more racks that house information and communication technology (ICT) devices in a facility, such as a data center.

2. Description of the Related Art

In a facility, such as a data center or server room, where ICT devices such as servers are installed, the temperature in the space where the ICT devices are housed is controlled by an air conditioning system for safe operation of the ICT devices. For example, in an air conditioning system designed for data centers, a plurality of racks that house ICT devices are arranged in multiple rows, and spaces (passages) between the rows of racks are divided into hot and cold aisles. The hot aisles are passages through which air from the ICT devices is discharged, whereas the cold aisles are passages to which cold air is supplied from the floor or ceiling. The air conditioning system thus separately controls the air conditioning in the hot aisles and that in the cold aisles, and thereby regulates the temperature in the space where the rows of racks are installed.

For example, U.S. Patent Application Publication No. 2005/0267639 discloses a technique for determining, using computational fluid dynamics (CFD), whether the airflow of air conditioning in a data center is optimized.

In many of the data centers described above, contact-type temperature sensors are installed at multiple points for the purposes of identifying and monitoring, for example, the cooling conditions of the ICT devices. However, with the contact-type temperature sensors, which are capable of measuring temperatures only at points where they are installed, it is difficult to precisely identify and monitor the temperatures.

Accordingly, a monitoring system designed for data centers has been required, in recent years, to measure temperatures over a surface region with non-contact temperature sensors, such as thermopile array sensors.

Before making the inventions of the present application, the inventors of the present application studied a function of a monitoring system designed for data centers where non-contact temperature sensors, such as thermopile array sensors, are used. The studied function includes measuring the surface temperature of a rack row on a cold aisle side in a server room with non-contact temperature sensors, and issuing an alarm, if the surface temperature exceeds a predetermined reference value, so as to notify the administrator or the like that air conditioning in the server room is insufficient. The study found out that there was the following problem.

Generally in a data center, a person may enter the server room for server maintenance or other purposes. A human's body temperature is normally higher than the surface temperature of a rack row on a cold aisle side. Therefore, if a person enters the space between a non-contact temperature sensor and a monitored surface of a rack row in the server room, the resulting rise in temperature measured by the non-contact temperature sensor may cause an alarm to be issued even when the surface temperature of the rack row does not actually rise.

SUMMARY

The present disclosure has been made in view of the problem described above. An object of the present disclosure is to reduce, in a temperature monitoring system that issues an alarm when the temperature measured by a non-contact temperature sensor exceeds a predetermined reference value, the occurrence of false alarms caused by a rise in measured temperature resulting from entry of a person into the space between the non-contact temperature sensor and an object whose temperature is monitored.

A monitoring apparatus (10, 10A, 10B) according to an aspect of the present disclosure includes a measured temperature acquiring unit (11) configured to acquire, from a non-contact temperature sensor (4), a measured temperature (141) on a surface of a rack (50) housing an ICT device; and an output section (20) configured to output an alarm related to a temperature of the rack on the basis of the measured temperature acquired by the measured temperature acquiring unit. The output section does not output the alarm for a predetermined time period when the amount of change in measured temperature exceeds a threshold.

In the monitoring apparatus, the output section may include an alarm unit (15) configured to issue the alarm in alarm mode when the measured temperature acquired by the measured temperature acquiring unit exceeds a reference value (145), and not to issue the alarm in non-alarm mode even when the measured temperature exceeds the reference value; a temperature change calculating unit (12) configured to calculate the amount of change (142) per unit time in measured temperature acquired by the measured temperature acquiring unit; and an operation mode managing unit (13) configured to change an operation mode of the alarm unit from alarm mode to non-alarm mode when the amount of change per unit time in measured temperature, the amount of change being calculated by the temperature change calculating unit, exceeds a first threshold (143).

In the monitoring apparatus (10, 10B), the operation mode managing unit (13, 13B) may change the operation mode from non-alarm mode to alarm mode when a predetermined time period (T1) elapses after changing the operation mode from alarm mode to non-alarm mode.

In the monitoring apparatus (10, 10B), the operation mode managing unit (13, 13B) may extend the duration of non-alarm mode if, before the predetermined time period elapses after changing the operation mode to non-alarm mode, the amount of change per unit time when the measured temperature rises exceeds the first threshold.

In the monitoring apparatus (10B), the operation mode managing unit (13B) may change the operation mode from non-alarm mode to alarm mode if, before the predetermined time period elapses after changing the operation mode to non-alarm mode, the amount of change per unit time when the measured temperature drops exceeds a second threshold (148), the amount of change being calculated by the temperature change calculating unit.

In the monitoring apparatus (10A), the operation mode managing unit (13A) may change the operation mode from non-alarm mode to alarm mode if the amount of change per unit time when the measured temperature drops exceeds a second threshold (148), the amount of change being calculated by the temperature change calculating unit.

In the monitoring apparatus (10, 10A, 10B), when the operation mode is non-alarm mode, the alarm unit may output information indicating that no alarm is issued.

A monitoring method according to another aspect of the present invention is a temperature monitoring method using an information processing apparatus (10, 10A, 10B) and issuing an alarm when a surface temperature of a monitored object (50) measured by a non-contact temperature sensor (4) exceeds a reference value (145). The monitoring method includes a first step (S1) of acquiring, by the information processing apparatus, a measured temperature (141) measured by the non-contact temperature sensor; a second step (S2) of calculating, by the information processing apparatus, the amount of change (142) per unit time in measured temperature on the basis of the measured temperature acquired in the first step; a third step (S3) of setting, by the information processing apparatus, an operation mode of the information processing apparatus to alarm mode if the amount of change per unit time when the measured temperature rises does not exceed a first threshold (143), the amount of change being calculated in the second step, and setting, by the information processing apparatus, the operation mode to non-alarm mode if the amount of change per unit time when the measured temperature rises exceeds the first threshold; and a fourth step (S4) of issuing, by the information processing apparatus, an alarm if the operation mode is alarm mode when the measured temperature acquired in the second step exceeds the reference value (145), and not issuing the alarm if the operation mode is non-alarm mode even when the measured temperature exceeds the reference value.

In the monitoring method, the third step may include a fifth step (S31, S32) of changing, by the information processing apparatus, the operation mode from alarm mode to non-alarm mode if the amount of change per unit time when the measured temperature rises exceeds the first threshold, the amount of change being calculated in the second step; and a sixth step (S33, S34) of returning, by the information processing apparatus, the operation mode from non-alarm mode to alarm mode when a predetermined time period (T1) elapses after changing the operation mode to non-alarm mode.

In the monitoring method, the third step may include a seventh step (S35, S36) of extending, by the information processing apparatus, the duration of non-alarm mode if, before the predetermined time period elapses after changing the operation mode to non-alarm mode, the amount of change per unit time when the measured temperature rises exceeds the first threshold.

In the monitoring method, the third step may include an eighth step (S33B, S34B) of returning, by the information processing apparatus, the operation mode from non-alarm mode to alarm mode if, before the predetermined time period elapses after changing the operation mode to non-alarm mode in the fifth step, the amount of change per unit time when the measured temperature drops exceeds a second threshold (148).

In the monitoring method, the third step may include a fifth step (S31A, S32A) of changing, by the information processing apparatus, the operation mode from alarm mode to non-alarm mode if the amount of change per unit time when the measured temperature rises exceeds the first threshold, the amount of change being calculated in the second step; and a sixth step (S33A, S34A) of returning, by the information processing apparatus, the operation mode from non-alarm mode to alarm mode if the amount of change per unit time when the measured temperature drops exceeds the second threshold, the amount of change being calculated in the second step.

The monitoring method may further include a step of outputting, by the information processing apparatus, information when the operation mode is non-alarm mode, the information indicating that no alarm is issued.

A program according to another aspect of the present disclosure is a program having the information processing apparatus execute each of the steps in the monitoring method described above.

The monitoring apparatus according to the present invention can reduce the occurrence of false alarms caused by a rise in measured temperature resulting from entry of a person into the space between the non-contact temperature sensor and the monitored object whose temperature is monitored.

DESCRIPTION OF THE PREFERRED EMBODIMENTS

Figure 1:
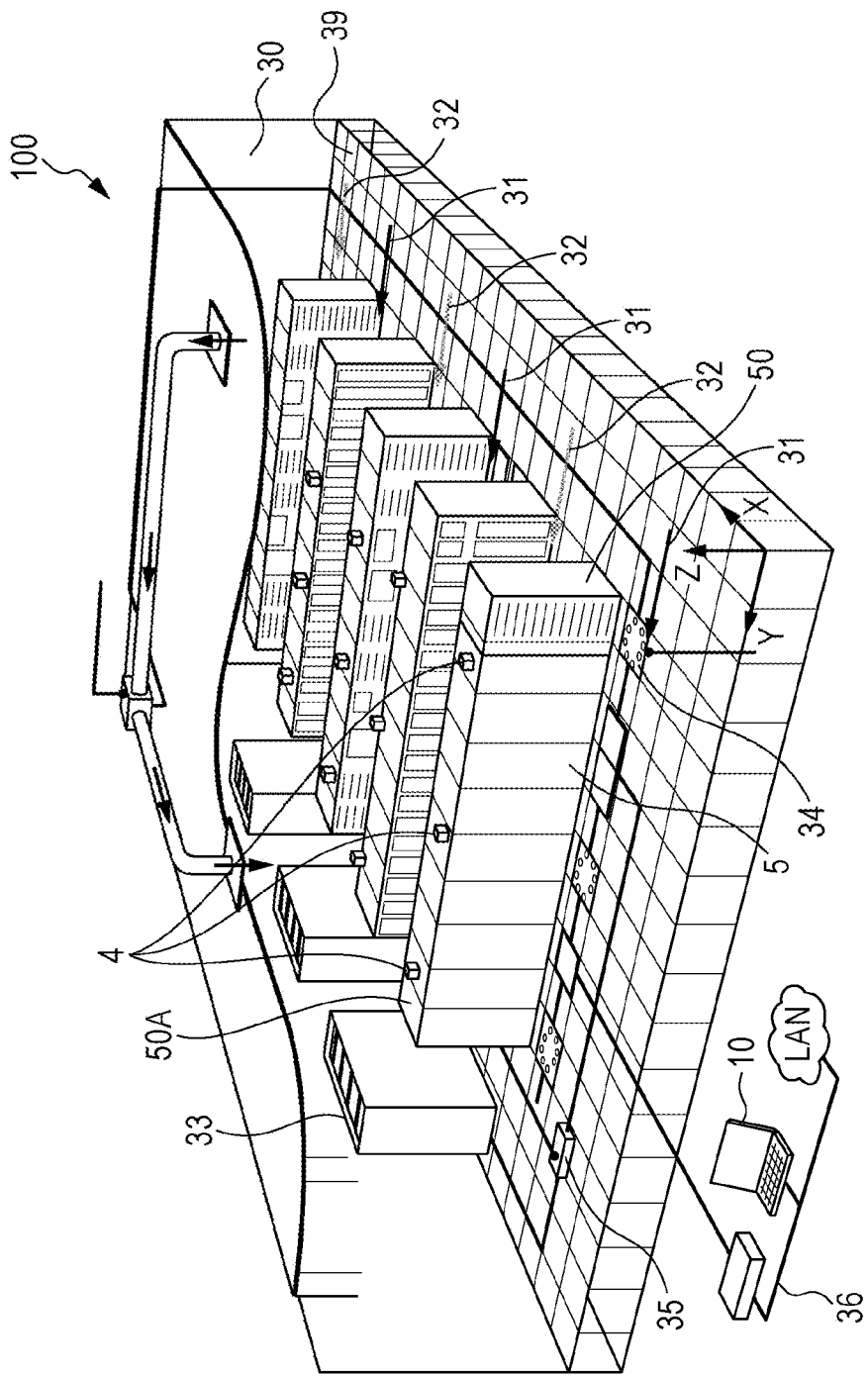
FIG. 1 is a perspective view illustrating a configuration of a temperature monitoring system including a monitoring apparatus according to an embodiment of the present disclosure.

Embodiments of the present disclosure will now be described with reference to the drawings. In the following description, components that are common among embodiments are denoted by the same reference numerals so as to omit redundant description.

Principles of the Present Disclosure

In a space, such as a server room, where the temperature therein is controlled by an air conditioning system, a change in rack surface temperature caused by supply of air for air conditioning in a cold aisle is often gradual, even when there is an abrupt change in the supply of air for air conditioning, because the rack surface has a certain amount of thermal capacity. On the other hand, if a person enters the space and a person's image is captured by a sensor, the temperature measured by the sensor often changes abruptly. The inventors of the present application focused attention on this, and discovered that it was possible to distinguish between them by observing a change in temperature measured by the sensor. That is, a monitoring apparatus according to the present disclosure is configured not to issue an alarm for a predetermined time period when the measured temperature changes abruptly. This can reduce the occurrence of false alarms (i.e., alarms issued even though air conditioning is working properly).

However, when, as described above, a time period is set during which no alarm is issued after the measured temperature changes abruptly, a true rack surface temperature is not observed if a person is present between the sensor and the rack surface. This means that while the person is present, the true rack surface temperature may rise and it may become necessary to issue an alarm. However, even when the method of the present disclosure is not applied, no alarm is issued in this situation. That is, it is still true that the method of the present disclosure has the advantage of reducing the occurrence of false alarms. It is preferable in this case to notify, in a manner distinguished from issuing an alarm, that no alarm can be issued due to the presence of a person between the sensor and the rack surface.

First Embodiment (Configuration of Temperature Monitoring System)

Figure 2:
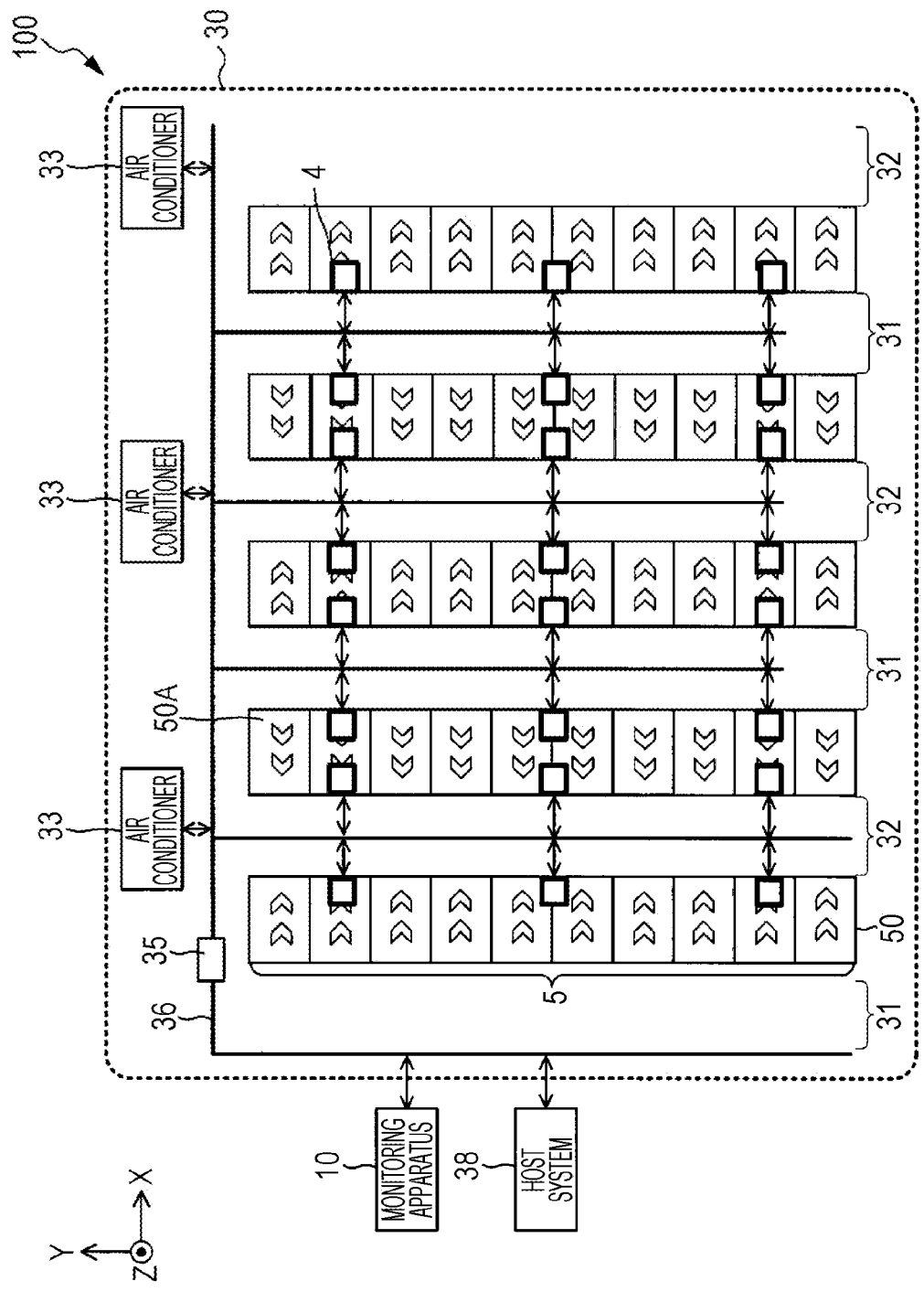
FIG. 2 is a plan view illustrating the configuration of the temperature monitoring system illustrated in FIG. 1.

FIG. 1 is a perspective view illustrating a configuration of a temperature monitoring system including a monitoring apparatus according to an embodiment of the present disclosure. FIG. 2 is a plan view illustrating the configuration of the temperature monitoring system illustrated in FIG. 1.

A temperature monitoring system 100 illustrated in FIGS. 1 and 2 is a system including a monitoring apparatus 10 that monitors the surface temperature of each monitored object with a non-contact temperature sensor, and issues an alarm when the surface temperature exceeds a reference value. In the present embodiment, the temperature monitoring system 100 is described as a system that monitors, with non-contact temperature sensors, the surface temperatures of racks that house ICT devices, for example, in a data center or server room.

The temperature monitoring system 100 monitors the surface temperature of each rack 50 installed in a predetermined three-dimensional space 30, such as a data center or server room.

The surface temperature of the rack 50 includes not only the surface temperature of the rack 50 alone, but also the surface temperature of at least one ICT device housed in the rack 50.

The rack 50 is a frame that houses the ICT device (not shown). The rack 50 may be, for example, a 19-inch rack. A plurality of racks 50 are arranged in the Y-axis direction in the three-dimensional space 30 to form one rack row 5. For example, FIGS. 1 and 2 illustrate the three-dimensional space 30 in which five rack rows 5, each containing ten racks 50, are arranged at predetermined intervals in the X-axis direction.

At least one air conditioner 33 is installed in the three-dimensional space 30 (which may hereinafter be simply referred to as "space 30"), and thus the temperature in the space 30 is controlled to a predetermined value. Specifically, as illustrated in FIGS. 1 and 2, the temperature in the space 30 is controlled to a predetermined value by dividing passages between the rack rows 5 adjacent in the X-axis direction into hot aisles 32 through which air from ICT devices is discharged and cold aisles 31 to which cold air from a cooling fan 34 on a floor 39 (or ceiling etc.) is supplied, and then separately controlling air conditioning in the hot aisles 32 and that in the cold aisles 31. In FIG. 2, a pattern given to each rack 50 indicates the direction of air flowing in the rack 50 (ICT device).

Temperature sensors 4 are installed on an upper surface 50A of each rack row 5, that is, on the surface opposite the surface of the rack row 5 secured to the floor 39 in the Z-axis direction. As illustrated in FIG. 2, the temperature sensors 4 are connected, for example, through a sensor hub 35. Data (e.g., thermal image data) representing the surface temperature of the rack row 5 detected by each temperature sensor 4 is transmitted through a wireless or wired communication line 36 (e.g., local area network (LAN)) to the monitoring apparatus 10, such as a PC, and a host system 38.

The monitoring apparatus 10 is installed, for example, in a central management room in the data center or in a section of the server room. The monitoring apparatus 10 is an information processing apparatus having the function of displaying, on the basis of received data, a thermal image of each rack row 5 and a trend graph of the surface temperature of each rack 50 on a display device, such as a liquid crystal display (LCD), and also the function of issuing an alarm when the surface temperature of the rack 50 exceeds a reference value.

By using the monitoring apparatus 10, the user can see the distribution of the surface temperature of each rack row 5, and can recognize the cooling conditions of air conditioning, the accumulation of heat, and the occurrence of abnormal heat generation and the like. The monitoring apparatus 10 will be described in detail later on.

The temperature sensors 4 are non-contact temperature sensors each configured to two-dimensionally measure the surface temperature of an object. The non-contact temperature sensor may be, for example, a thermopile array sensor.

The thermopile array sensor is a sensor with a two-dimensional array of thermopiles which are thermoelectric conversion elements (infrared sensors) each composed of thermocouples and configured to detect infrared radiation.

By using thermopile array sensors as the temperature sensors 4, the user can see a two-dimensional temperature distribution of each of the rack rows 5 arranged in the space 30. The present embodiment will be described on the assumption that the temperature sensors 4 are thermopile array sensors.

In the present embodiment, "n" temperature sensors 4 (where "n" is an integer greater than one) are installed in the space 30, and may be denoted as temperature sensors 4_1 to 4_n.

An example of positional restriction on the installation of sensors is that the temperature sensors 4 are each installed on the upper surface 50A of a rack row 5 adjacent in the X-axis direction to a monitored rack row 5.

Figure 3:
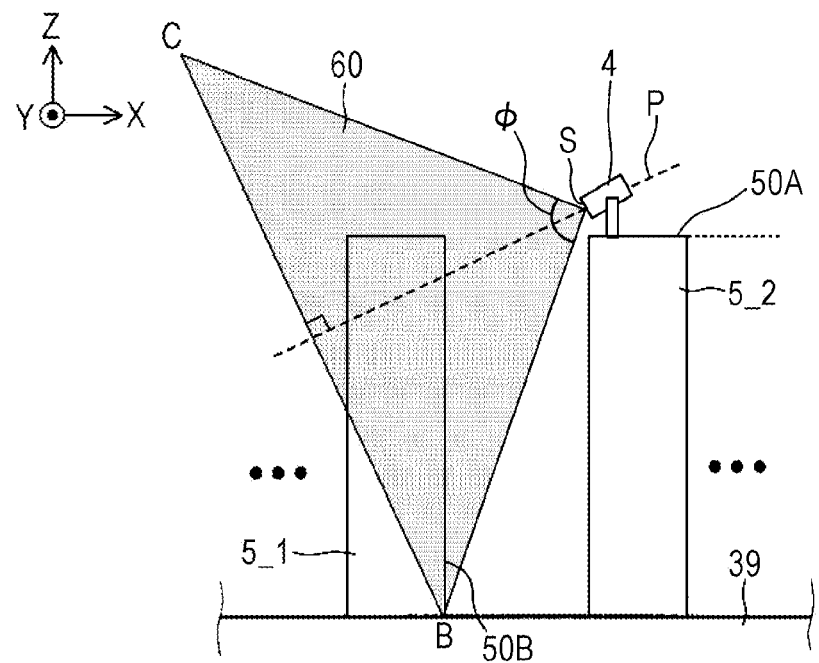
FIG. 3 illustrates an example of how a temperature sensor is positioned.

Specifically, as illustrated in FIG. 3, the temperature sensor 4 is installed on the upper surface 50A of a rack row 5_2 adjacent in the X-axis direction to a monitored rack row 5_1, with a temperature detecting surface S of the temperature sensor 4 directed toward a monitored surface 50B of the rack row 5_1. The temperature detecting surface S is a sensor surface of the temperature sensor 4 capable of detecting temperatures. For example, when the temperature sensor 4 is a thermopile array sensor, the temperature detecting surface S is a surface where a plurality of thermocouples in a light receiving element are two-dimensionally arranged.

In FIG. 3, reference character φ denotes the field of view of the temperature sensor 4 and represents a value described, for example, in the specification of the temperature sensor 4, such as a thermopile array sensor. Reference character P denotes the axis of the temperature sensor 4 perpendicular to the temperature detecting surface S of the temperature sensor 4, and indicates the direction of the temperature detecting surface S of the temperature sensor 4.

A temperature detection region 60 where the temperature sensor 4 can detect temperatures is defined on the basis of the field of view φ. For example, when the temperature detection region 60 for the temperature sensor 4 has a regular quadrilateral pyramidal shape, a monitorable region 61 in the rack row 5 monitored by the temperature sensor 4 has a range illustrated in FIG. 4. That is, a range (monitorable region 61) where the surface temperature of the monitored rack row 5_1 can be monitored by the temperature sensor 4 installed on the rack row 5_2 adjacent to the rack row 5_1 in the X-axis direction (see FIG. 3) has a trapezoidal cross-sectional shape (see FIG. 4) obtained by cutting the temperature detection region 60 having a regular quadrilateral pyramidal shape at the surface 50B of the monitored rack row 5_1.

Figure 4:
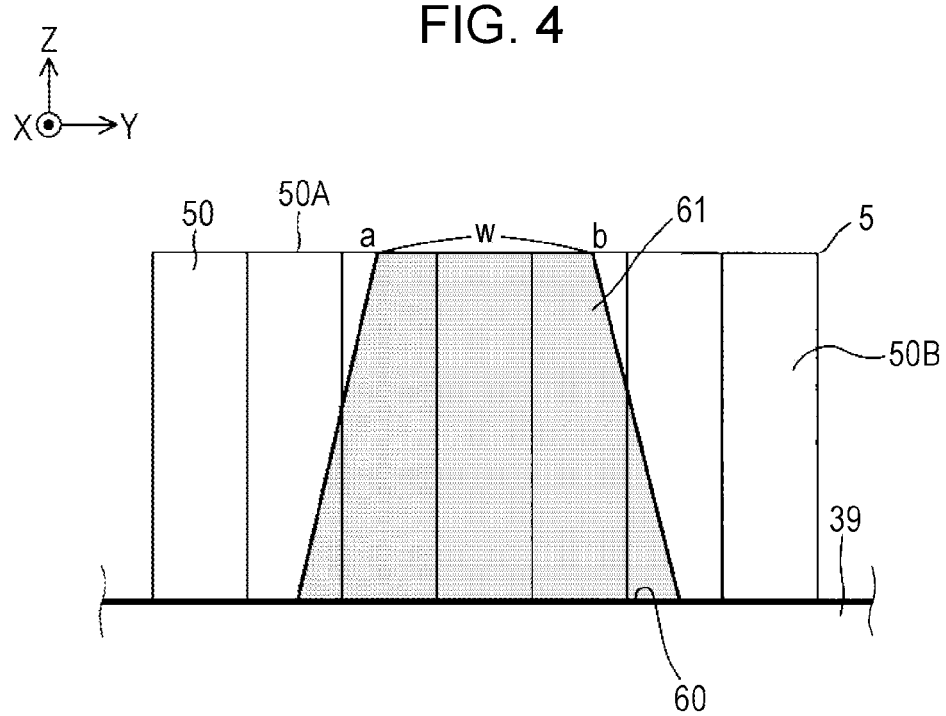
FIG. 4 illustrates a temperature detection region based on the field of view of the temperature sensor.
Figure 5:
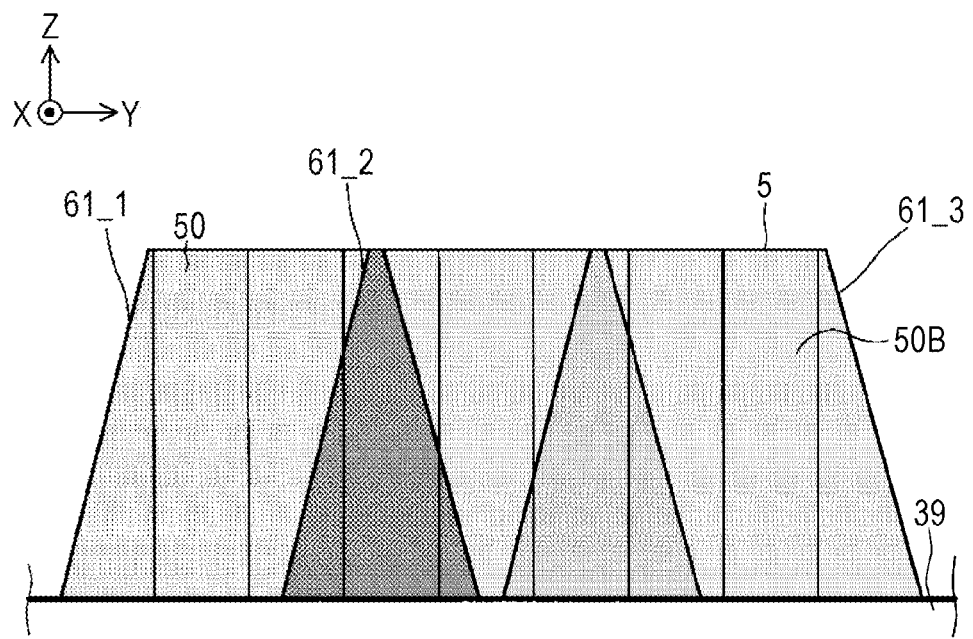
FIG. 5 illustrates monitorable regions in a rack row monitored by temperature sensors.

In the example of FIG. 4, a range where the surface temperature of the surface 50B of the rack row 5_1 can be monitored by one temperature sensor 4 is the monitorable region 61 indicated by shading. To thoroughly monitor the entire surface 50B of the rack row 5_1, a plurality of temperature sensors 4 may be properly arranged for one monitored rack row 5_1 in the Y-axis direction, as illustrated in FIG. 2. This allows the surface temperature of one rack row 5 to be thoroughly monitored, as indicated by monitorable regions 61_1, 61_2, and 61_3 in FIG. 5. The monitored object does not necessarily need to be the entire rack row, and may be specified as necessary.

For example, the temperature sensors 4 are each configured to generate and output thermal images of the monitorable region 61 every unit time. The temperature sensors 4 each generate, for example, several hundreds of thermal images per minute, and transmit them through the communication line 36 to the monitoring apparatus 10 and the host system 38.

(Configuration of Monitoring Apparatus 10 of First Embodiment)

The monitoring apparatus 10 according to a first embodiment will now be described in detail.

Figure 6A:
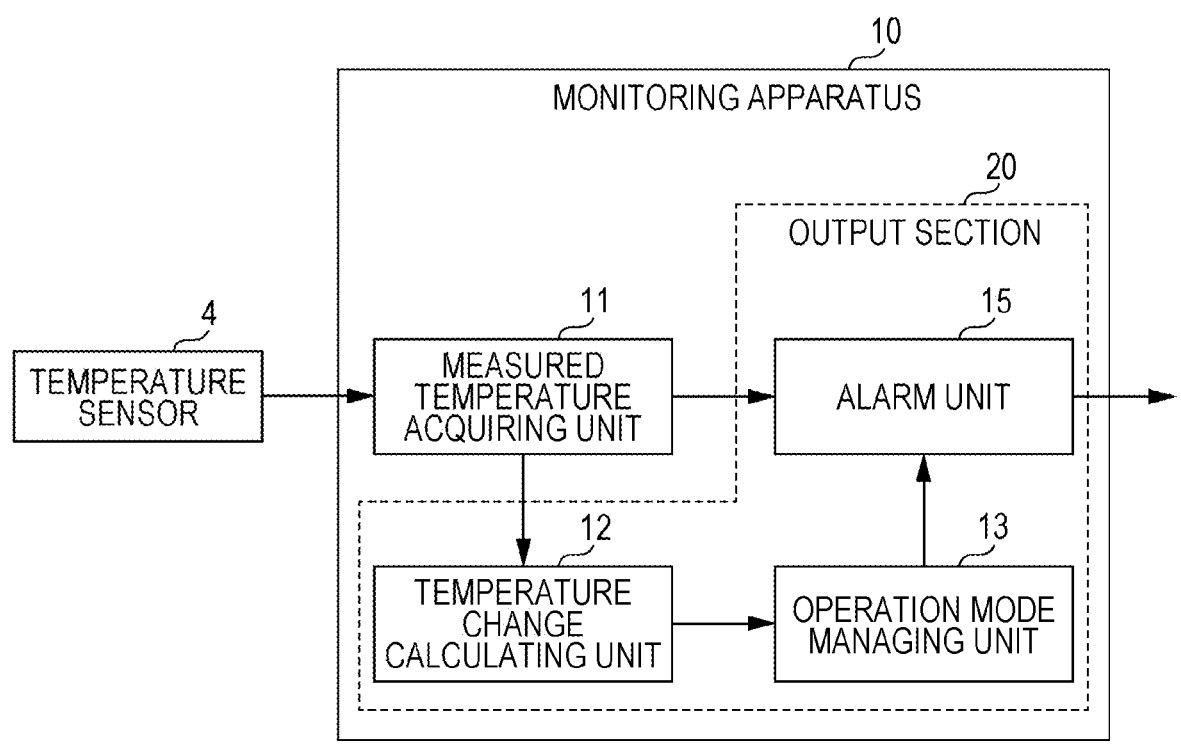
FIG. 6A conceptually illustrates a configuration of the monitoring apparatus according to a first embodiment.
Figure 6B:
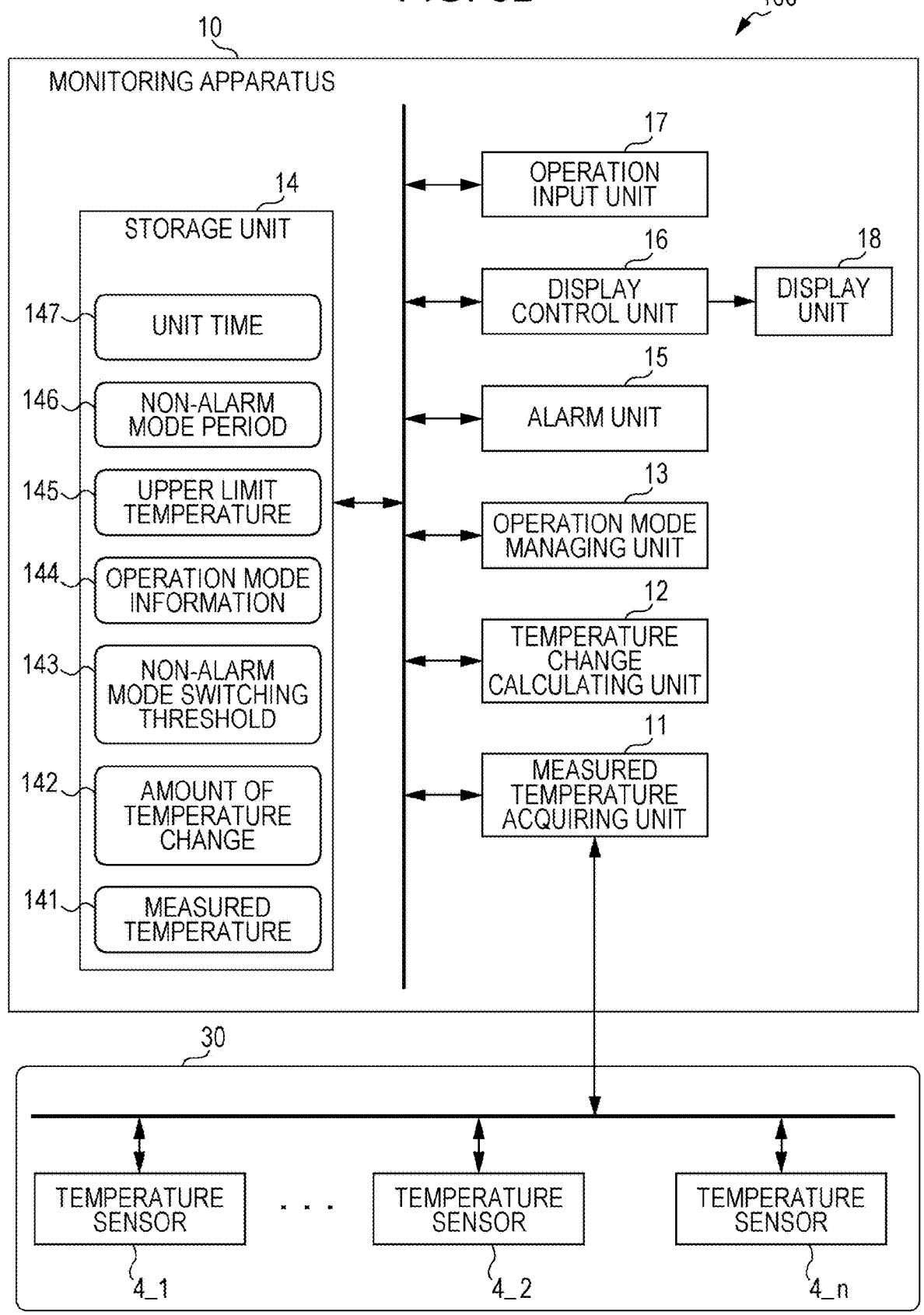
FIG. 6B illustrates a detailed configuration of the monitoring apparatus according to the first embodiment.

FIG. 6A conceptually illustrates a configuration of the monitoring apparatus 10 according to the first embodiment. FIG. 6B illustrates a detailed configuration of the monitoring apparatus 10 according to the first embodiment.

Of functional units included in the temperature monitoring system 100, only those required to describe the monitoring apparatus 10 are shown in FIGS. 6A and 6B, and the other functional units are not shown.

As described above, the monitoring apparatus 10 according to the first embodiment has the function of displaying, on the basis of data of the surface temperatures of the racks 50 measured by the temperature sensors 4, a thermal image of each rack row 5 and a trend graph of the surface temperature of each rack 50 on the display device, such as an LCD, and also the function of issuing an alarm when the surface temperature of the rack 50 exceeds a reference value. Additionally, the monitoring apparatus 10 has the function of reducing the occurrence of false alarms caused by entry of a person into the space between the temperature sensor 4 and the monitored rack 50.

As illustrated in FIG. 6A, the monitoring apparatus 10 conceptually includes a measured temperature acquiring unit 11 configured to acquire the measured temperature of a monitored object from a non-contact temperature sensor, and an output section 20 configured to output an alarm related to the temperature of the monitored object on the basis of the measured temperature acquired by the measured temperature acquiring unit 11. The output section 20 does not output the alarm for a predetermined time period when the amount of change in measured temperature exceeds a threshold.

Specifically, as illustrated in FIG. 6B, the monitoring apparatus 10 includes the measured temperature acquiring unit 11, a temperature change calculating unit 12, an operation mode managing unit 13, a storage unit 14, an alarm unit 15, a display control unit 16, an operation input unit 17, and a display unit 18.

The monitoring apparatus 10 is implemented, for example, by a computer (information processing apparatus), which is a hardware resource, and a program installed on the computer. More specifically, the measured temperature acquiring unit 11, the temperature change calculating unit 12, the operation mode managing unit 13, the storage unit 14, the alarm unit 15, the display control unit 16, the operation input unit 17, and the display unit 18 described above are implemented by controlling hardware resources included in the computer in accordance with the program. The hardware resources included in the computer include a program processor, such as a central processing unit (CPU); storage devices, such as a random-access memory (RAM), a read-only memory (ROM), and a hard disc drive (HDD); input devices used to externally input information, such as a keyboard, a mouse, and a touch panel; a communication device for wired or wireless transmission and reception of various types of information through a communication line, such as a LAN; and a display device, such as an LCD. The program described above may be recorded on, and provided in the form of, a recording medium, such as a CD-ROM, a DVD-ROM, or a memory card.

The operation input unit 17 includes a keyboard, a mouse, and a touch panel used to input user's operation. The operation input unit 17 outputs a signal corresponding to the operation.

The measured temperature acquiring unit 11 is a functional unit configured to acquire thermal images of the rack rows 5 in the space 30 captured by the temperature sensors 4_1 to 4_n. The measured temperature acquiring unit 11 sequentially acquires, as a measured temperature 141 of each rack row 5, thermal images of the rack row 5 captured every predetermined time period by corresponding one of the temperature sensors 4_1 to 4_n, and stores the measured temperature 141 in the storage unit 14.

The storage unit 14 is a functional unit configured to store various type of data required for the monitoring apparatus 10 to implement the functions described above. For example, the storage unit 14 stores data including not only the measured temperature 141 described above, but also operation mode information 144, the amount of temperature change 142, a non-alarm mode switching threshold 143, an upper limit temperature 145, and a non-alarm mode period 146 described below.

The operation mode information 144 is information indicating the operation mode of the monitoring apparatus 10, or more specifically, the operation mode of the alarm unit 15. As operation modes, the monitoring apparatus 10 has "alarm mode" in which the monitoring apparatus 10 issues an alarm when the temperature measured by the temperature sensor 4 exceeds a predetermined reference value, and "non-alarm mode" in which the monitoring apparatus 10 issues no alarm even when the temperature measured by the temperature sensor 4 exceeds the predetermined reference value. In the storage unit 14, one of "alarm mode" and "non-alarm mode" is set as the operation mode information 144.

The display control unit 16 is a functional unit configured to display various types of information on the screen of the display unit 18 by controlling the display unit 18. The display unit 18 is formed, for example, by an LCD. The display unit 18 may be implemented independently of other functional units, or may be implemented as a touch panel integrally formed, for example, with the operation input unit 17.

Figure 7:
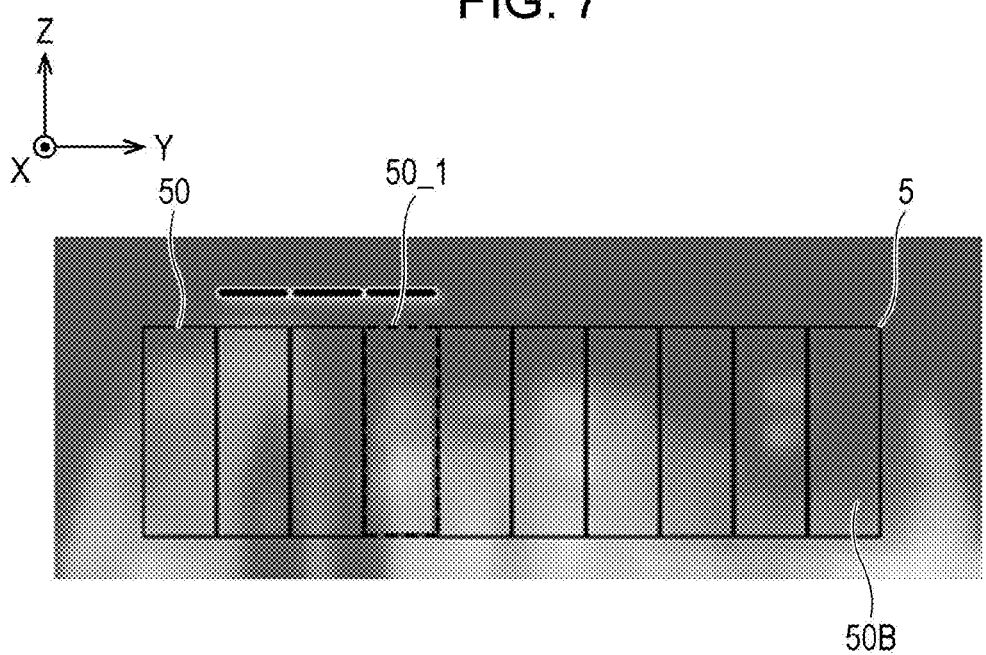
FIG. 7 illustrates a thermal image of one rack row.
Figure 8:
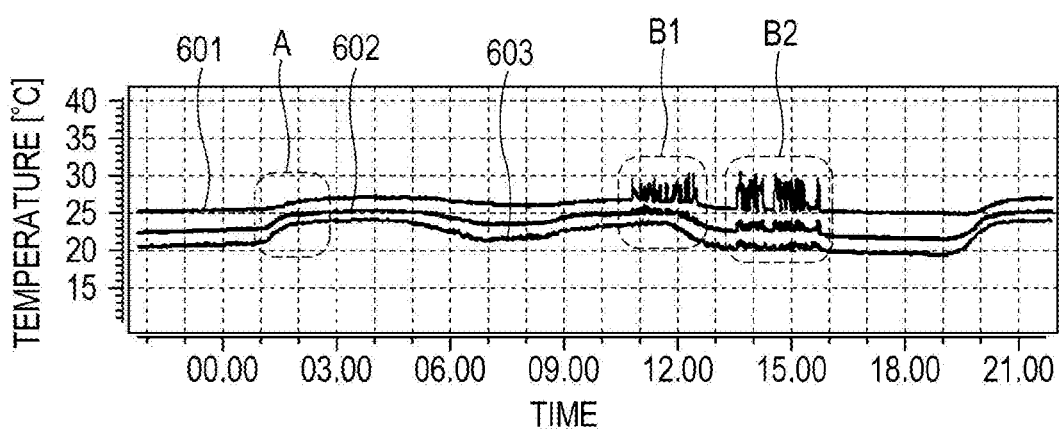
FIG. 8 is a trend graph showing how the surface temperature of one rack changes.

Specifically, on the basis of data stored in the storage unit 14, the display control unit 16 causes the display unit 18 to display various types of information corresponding to instructions input from the user through the operation input unit 17. FIGS. 7 and 8 each illustrate an example of information displayed in the display unit 18.

FIG. 7 illustrates a thermal image of one rack row 5 in the space 30.

As illustrated in FIG. 7, when one rack row 5 is selected, for example, through the operation input unit 17, the display control unit 16 reads from the storage unit 14 the measured temperature 141 of the rack row 5 at a given time point, and causes the display unit 18 to display the measured temperature 141 as a thermal image.

FIG. 8 is a trend graph showing how the surface temperature of one rack 50 in the space 30 changes.

Specifically, FIG. 8 shows a maximum temperature 601, a mean temperature 602, and a minimum temperature 603 in a region corresponding to one rack 50_1 in the rack row 5 illustrated in FIG. 7.

When one rack 50_1 is selected, for example, through the operation input unit 17 from the rack row 5 whose thermal image is illustrated in FIG. 7, the display control unit 16 causes the display unit 18 to display the trend graph of FIG. 8 showing how the maximum temperature 601, the mean temperature 602, and the minimum temperature 603 in the region corresponding the selected rack 50_1 change with time.

The trend graph of FIG. 8 shows a range A where the temperature changes gradually and ranges B1 and B2 where the temperature changes abruptly. The range A shows how the temperature of the rack surface is changed by air conditioning, whereas the ranges B1 and B2 show how the temperature is changed by entry of a person into the space between the temperature sensor 4 and the monitored rack 50_1. As shown, there is a difference in the amount of temperature change per unit time between when the temperature of the rack surface is changed by air conditioning and when the temperature is changed by entry of a person into the space between the temperature sensor 4 and the monitored rack 50_1.

Accordingly, in the monitoring apparatus 10, the temperature change calculating unit 12 calculates the amount of change in measured temperature per unit time, and the operation mode managing unit 13 switches the operation mode of the monitoring apparatus 10 from alarm mode to non-alarm mode when the calculated amount of change in temperature exceeds a predetermined threshold. Hereinafter, the temperature change calculating unit 12 and the operation mode managing unit 13 will be described in detail.

The temperature change calculating unit 12 is a functional unit configured to differentiate the measured temperature 141 with respect to time (i.e., to calculate the amount of change in measured temperature 141 per unit time) on the basis of the measured temperature 141 acquired by the measured temperature acquiring unit 11.

The "measured temperature" for which to calculate the amount of temperature change may be, as illustrated in FIG. 8, the maximum temperature 601 or minimum temperature 603 in the region corresponding to one rack 50, or the mean temperature 602 in the same region. In the present embodiment, for example, the amount of change per unit time in maximum temperature 601 in the region corresponding to one rack 50 is calculated as the amount of temperature change 142.

Specifically, each time data of the measured temperature 141 is stored in the storage unit 14, the temperature change calculating unit 12 calculates, for each rack 50, the amount of change per unit time in measured temperature in the region corresponding to the rack 50, and sequentially stores it as the amount of temperature change 142 in the storage unit 14.

For example, when the measured temperature 141 at time ta is stored in the storage unit 14, the temperature change calculating unit 12 subtracts a maximum temperature Tmax_b at time tb (=ta−ts, where ts is unit time) in the region corresponding to a predetermined rack 50_1 from a maximum temperature Tmax_a at time ta in the region corresponding to the rack 50_1 to calculate the amount of change ΔT=Tmax_a−Tmax_b, and stores the calculated amount of change ΔT in the storage unit 14 as the amount of temperature change 142 per unit time ts for the rack 50_1. The amount of temperature change 142 when the measured temperature rises stored as a positive value in the storage unit 14, whereas the amount of temperature change 142 when the measured temperature drops is stored as a negative value in the storage unit 14.

The value of unit time ts is stored as unit time 147 in the storage unit 14, and may be capable of being rewritten, for example, by input of data through the operation input unit 17 or by input of data through a communication line.

The operation mode managing unit 13 is a functional unit configured to switch the operation mode information 144 stored in the storage unit 14 from "alarm mode" to "non-alarm mode" when detecting a rise in measured temperature exceeding a predetermined threshold.

Specifically, if the amount of temperature change 142 per unit time when the measured temperature rises, the amount of temperature chance 142 being calculated by the temperature change calculating unit 12, does not exceed a predetermined threshold, the operation mode managing unit 13 sets the operation mode information 144 in the storage unit 14 to "alarm mode", whereas if the amount of temperature change 142 per unit time when the measured temperature rises exceeds the predetermined threshold, the operation mode managing unit 13 sets the operation mode information 144 in the storage unit 14 to "non-alarm mode". Each time the amount of temperature change 142 is calculated by the temperature change calculating unit 12, the operation mode managing unit 13 executes the process for determining the operation mode described above.

The predetermined threshold described above is a value that defines a reference value for the amount of temperature rise per unit time. Hereinafter, the predetermined threshold is referred to as "non-alarm mode switching threshold 143". The non-alarm mode switching threshold 143 is stored in the storage unit 14. The value of the non-alarm mode switching threshold 143 may be capable of being rewritten, for example, by input of data through the operation input unit 17 or by input of data through a communication line.

When a predetermined time period T1 elapses after changing the operation mode information 144 to "non-alarm mode", the operation mode managing unit 13 changes the operation mode information 144 from "non-alarm mode" to "alarm mode" again.

Information representing the duration (predetermined time period T1) of non-alarm mode is stored as "non-alarm mode period 146" in the storage unit 14. Information of the non-alarm mode period 146 (i.e., the value of the predetermined time period T1) may be capable of being rewritten, for example, by input of data through the operation input unit 17 or by input of data through a communication line.

Figure 9:
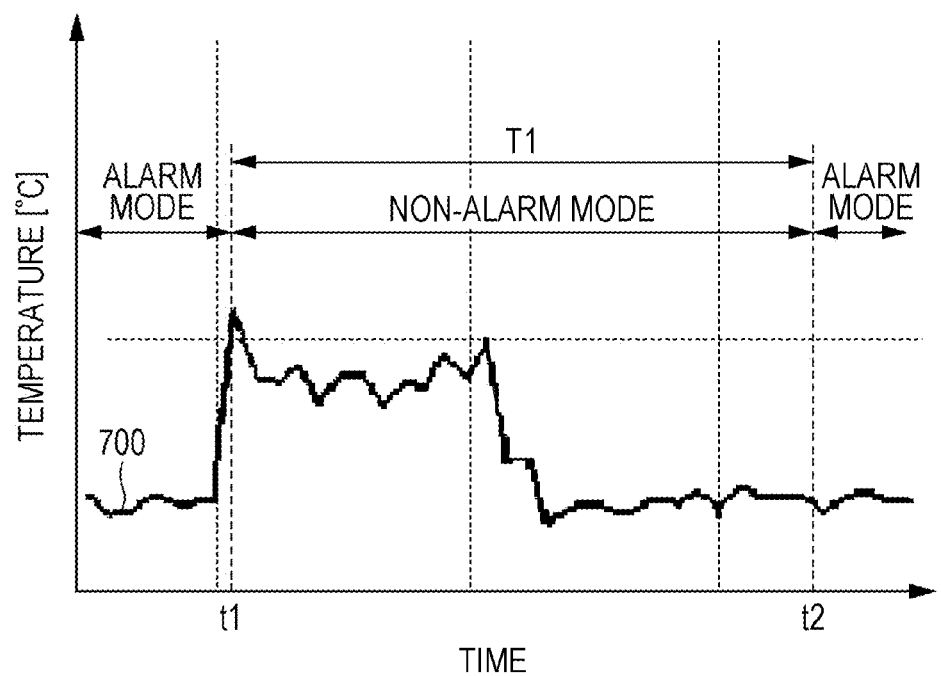
FIG. 9 is a diagram for explaining an operation mode switching process performed by the monitoring apparatus according to the first embodiment.

FIG. 9 is a diagram for explaining an operation mode switching process performed by the monitoring apparatus 10 according to the first embodiment.

In FIG. 9, the horizontal axis represents time and the vertical axis represents temperature. A curve denoted by reference numeral 700 in FIG. 9 indicates how the surface temperature (maximum temperature) of a given rack 50 changes with time.

For example, in the initial state after the monitoring apparatus 10 is turned on, the operation mode information 144 in the storage unit 14 is "alarm mode". Then if, as illustrated in FIG. 9, the amount of temperature change 142 per unit time when the measured temperature of the rack 50 rises, the amount of temperature change 142 being calculated by the temperature change calculating unit 12, exceeds the non-alarm mode switching threshold 143 at time t1, the operation mode managing unit 13 changes the operation mode information 144 in the storage unit 14 from "alarm mode" to "non-alarm mode".

At this point, the operation mode managing unit 13 sets, for example on a timer (not shown) in the information processing apparatus forming the monitoring apparatus 10, a value (T1) based on the non-alarm mode period 146 stored in the storage unit 14, and causes the timer to start timing. Then, when receiving, time t2 in FIG. 9, from the timer a notification indicating that the predetermined time period T1 has elapsed, the operation mode managing unit 13 returns the operation mode information 144 in the storage unit 14 from "non-alarm mode" to "alarm mode".

If a temperature rise exceeding the non-alarm mode switching threshold 143 is detected again before the predetermined time period T1 elapses after switching the operation mode information 144 from "alarm mode" to "non-alarm mode", the operation mode managing unit 13 extends the duration of non-alarm mode. For example, if, after the timer starts timing, the amount of temperature change 142 per unit time when the measured temperature rises exceeds the non-alarm mode switching threshold 143, the operation mode managing unit 13 resets the timer, sets a value on the timer again, and thereby causes the timer to start timing again. The value set again on the timer is not particularly limited, and may be a value (T1) equal to the non-alarm mode period 146, or a value different from the non-alarm mode period 146.

The alarm unit 15 is a functional unit configured to issue an alarm for notifying the user of information, such as abnormality in the temperature of a monitored rack row 5. For example, the alarm may be issued by displaying information in the display unit 18 through the display control unit 16, or by sounding an audible alarm from a speaker externally connected to the alarm unit 15.

Specifically, if the measured temperature 141 acquired by the measured temperature acquiring unit 11 exceeds a predetermined threshold, the alarm unit 15 issues an alarm when the operation mode information 144 is "alarm mode", and issues no alarm when the operation mode information 144 is "non-alarm mode".

The threshold described above is, for example, a value representing the upper limit of an allowable range of the surface temperature of the rack 50. Hereinafter the threshold is referred to as "upper limit temperature 145", and information of the upper limit temperature 145 is stored in the storage unit 14. The information of the upper limit temperature 145 may be capable of being rewritten, for example, by input of data through the operation input unit 17 or by input of data through a communication line.

When the operation mode information 144 is "non-alarm mode", the alarm unit 15 may output information indicating that no alarm is issued. For example, when the operation mode information 144 is switched from "alarm mode" to "non-alarm mode", the alarm unit 15 may display, on the screen of the display unit 18 through the display control unit 16, information indicating that an alarm for notifying that the temperature of the rack 50 exceeds an upper limit value is not issued.

(Flow of Monitoring Process Performed by Monitoring Apparatus 10 of First Embodiment)

A monitoring process performed by the monitoring apparatus 10 according to the first embodiment will now be described.

Figure 10:
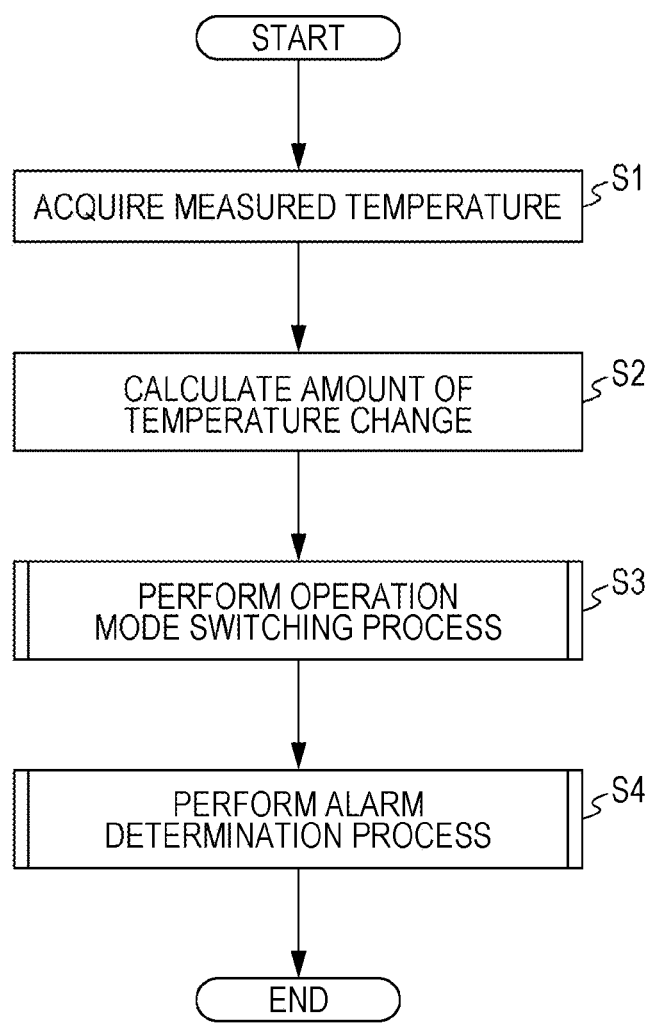
FIG. 10 is a flowchart illustrating a process of how the monitoring apparatus of the first embodiment monitors the surface temperature of each rack row.

FIG. 10 is a flowchart illustrating a process of monitoring the surface temperature of each rack row 5.

In the initial state after the monitoring apparatus 10 is turned on, the operation mode information 144 in the storage unit 14 is "alarm mode".

First, the monitoring apparatus 10 causes the measured temperature acquiring unit 11 to acquire thermal images from the temperature sensors 4_1 to 4_n using the technique described above, and then to store the acquired thermal images as the measured temperature 141 in the storage unit 14 (S1). Next, the monitoring apparatus 10 causes the temperature change calculating unit 12 to calculate the amount of change in measured temperature 141 per unit time for each rack 50 using the technique described above, and then to store the calculated amount of change as the amount of temperature change 142 in the storage unit 14 (S2). Next, the monitoring apparatus 10 causes the operation mode managing unit 13 to set the operation mode of the monitoring apparatus 10 on the basis of the amount of temperature change 142 calculated in step S2. Then, the monitoring apparatus 10 determines whether to issue an alarm on the basis of the measured temperature 141 acquired in step S1 and the operation mode set in step S3 (S4).

Step S3 (operation mode switching process) in the monitoring process (see FIG. 10) performed by the monitoring apparatus 10 will now be described in detail.

Figure 11:
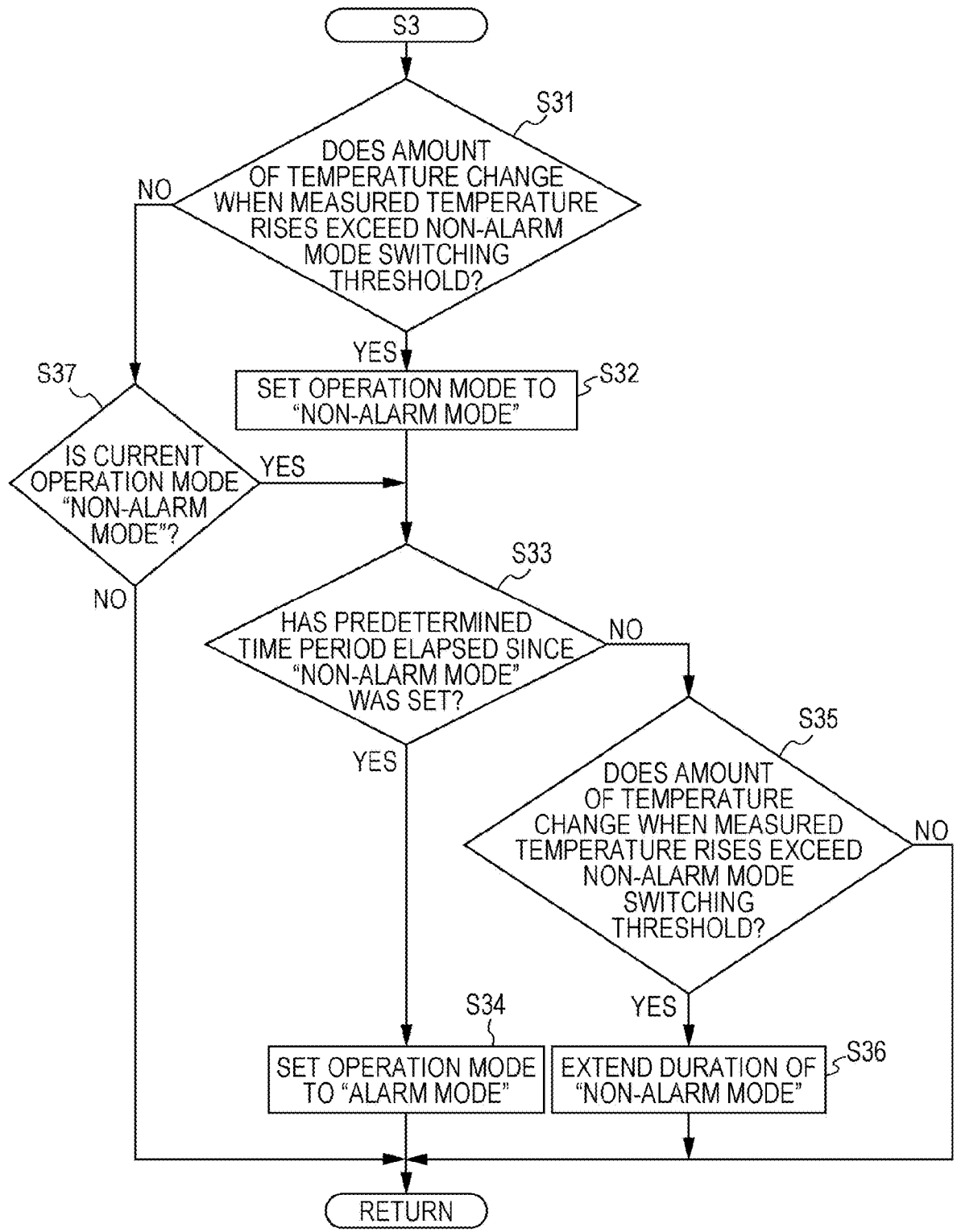
FIG. 11 illustrates a flow of an operation mode switching process (step S3) in the monitoring process according to the first embodiment.

FIG. 11 illustrates a flow of the operation mode switching process in step S3 of FIG. 10.

In the operation mode switching process, first, the operation mode managing unit 13 determines whether the amount of temperature change 142 when the measured temperature of each rack 50 rises, the amount of temperature change 142 being stored in the storage unit 14, exceeds the non-alarm mode switching threshold 143 (S31). If the amount of temperature change 142 does not exceed the non-alarm mode switching threshold 143 in step S31, the operation mode managing unit 13 determines whether the current operation mode is "non-alarm mode" (S37). If the current operation mode is "alarm mode", not "non-alarm mode", in step S37, the operation mode managing unit 13 does not change the operation mode information 144 in the storage unit 14, and the process proceeds to step S4.

If the amount of temperature change 142 when the measured temperature rises exceeds the non-alarm mode switching threshold 143 in step S31, the operation mode managing unit 13 switches the operation mode information 144 stored in the storage unit 14 from "alarm mode" to "non-alarm mode" (S32). At this point, with the technique described above, the operation mode managing unit 13 starts counting the duration T1 of non-alarm mode using the timer. At the same time, the alarm unit 15 may display, in the display unit 18, information indicating that the monitoring apparatus 10 is in non-alarm mode.

When setting the operation mode to "non-alarm mode" in step S32, or determining that the current operation mode is "non-alarm mode" in step S37, the operation mode managing unit 13 determines whether the predetermined time period T1 has elapsed since "non-alarm mode" was set (S33). If the predetermined time period T1 has elapsed in step S33, the operation mode managing unit 13 switches the operation mode information 144 stored in the storage unit 14 from "non-alarm mode" to "alarm mode" (S34).

On the other hand, if the predetermined time period T1 has not elapsed in step S33, the operation mode managing unit 13 determines whether the amount of temperature change 142 when the measured temperature rises exceeds the non-alarm mode switching threshold 143 (S35).

If the amount of temperature change 142 does not exceed the non-alarm mode switching threshold 143 in step S35, the process proceeds to step S4. On the other hand, if the amount of temperature change 142 exceeds the non-alarm mode switching threshold 143 in step S35, the operation mode managing unit 13 extends the duration of non-alarm mode using the technique described above (S36).

Step S4 (alarm determination process) in the monitoring process (see FIG. 10) performed by the monitoring apparatus 10 will now be described in detail.

Figure 12:
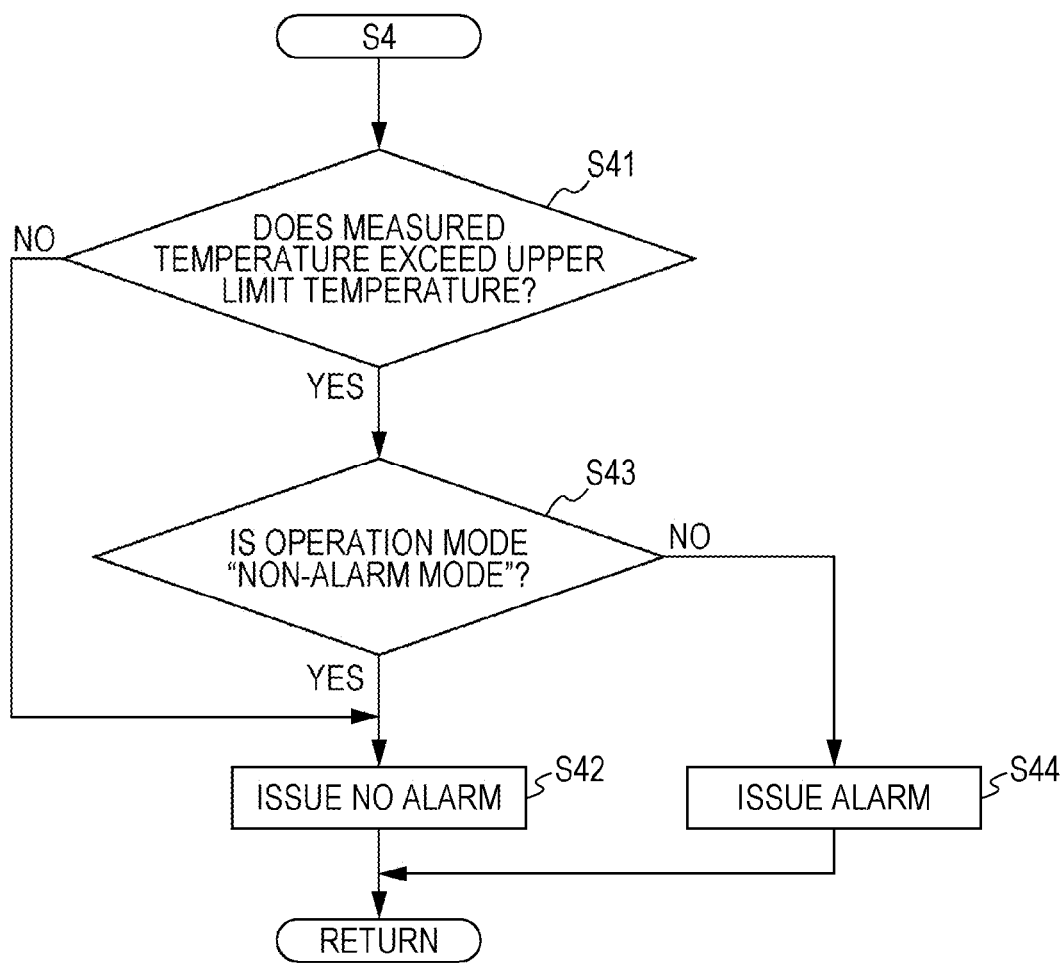
FIG. 12 illustrates a flow of an alarm determination process (step S4) in the monitoring process according to the first embodiment.

FIG. 12 illustrates a flow of the alarm determination process in step S4 of FIG. 10 for determining whether to issue an alarm.

In step S4, the alarm unit 15 first determines whether the measured temperature 141 of each rack 50 stored in the storage unit 14 exceeds the upper limit temperature 145 (S41). If the measured temperature 141 of the rack 50 does not exceed the upper limit temperature 145 in step S41, the alarm unit 15 issues no alarm (S42).

On the other hand, if the measured temperature 141 of the rack 50 exceeds the upper limit temperature 145 in step S41, the alarm unit 15 determines whether the operation mode information 144 in the storage unit 14 is "non-alarm mode" (S43).

If the operation mode information 144 in the storage unit 14 is "non-alarm mode" in step S43, the alarm unit 15 issues no alarm (S42). On the other hand, if the operation mode information 144 in the storage unit 14 is not "non-alarm mode" in step S43, that is, if the operation mode information 144 in the storage unit 14 is "alarm mode", the alarm unit 15 issues an alarm (S44).

(Advantageous Effect of Monitoring Apparatus 10 of First Embodiment)

Figure 13:
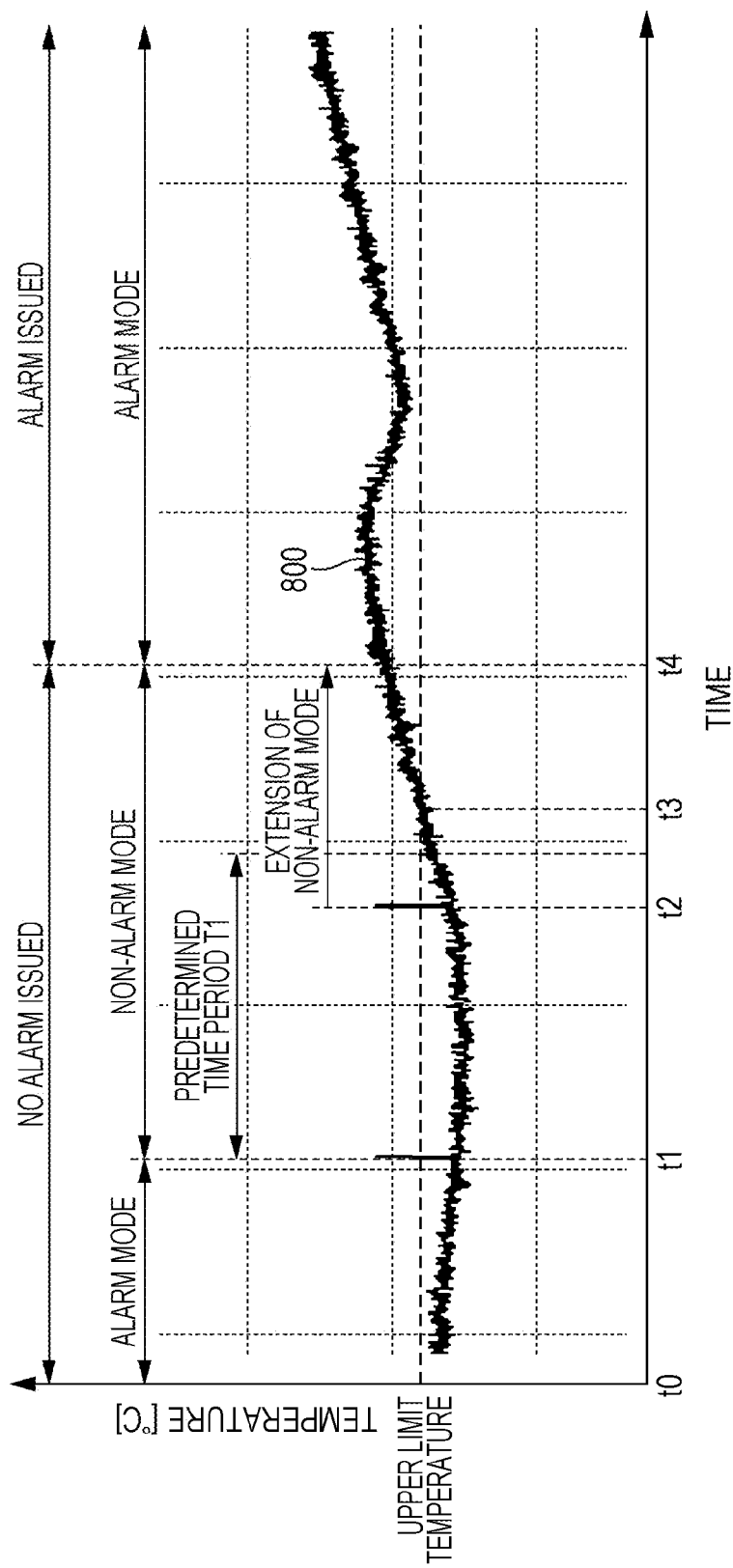
FIG. 13 is a diagram for explaining an operation of the monitoring apparatus according to the first embodiment.

FIG. 13 is a diagram for explaining an operation of the monitoring apparatus 10 according to the first embodiment.

In FIG. 13, the horizontal axis represents time and the vertical axis represents temperature. A curve denoted by reference numeral 800 in FIG. 13 indicates how the measured temperature (maximum temperature) of a given rack 50 changes with time.

As illustrated in FIG. 13, the operation mode information 144 is "alarm mode" in the period from time t0 to time t1. During this period, where the measured temperature 141 is below the upper limit temperature 145, the monitoring apparatus 10 issues no alarm.

At time t1, when, for example, a person enters the space between the temperature sensor 4 and the monitored rack 50, the resulting rise in measured temperature exceeds the non-alarm mode switching threshold 143. At this point, the monitoring apparatus 10 switches the operation mode from "alarm mode" to "non-alarm mode".

When, at time t2 before the duration of non-alarm mode (i.e., predetermined time period T1) ends, a person enters the space between the temperature sensor 4 and the monitored rack 50 again, the resulting rise in measured temperature exceeds the non-alarm mode switching threshold 143. In this case, the monitoring apparatus 10 extends the duration of non-alarm mode.

Then, the surface temperature of the monitored rack 50 gradually increases and the measured temperature 141 exceeds the upper limit temperature 145 at time t3. The monitoring apparatus 10 issues no alarm at this point, as the operation mode of the monitoring apparatus 10 is non-alarm mode.

At time t4, the duration of non-alarm mode ends and the operation mode of the monitoring apparatus 10 is changed from non-alarm mode to alarm mode. At this point, where the measured temperature 141 exceeds the upper limit temperature 145, the monitoring apparatus 10 issues an alarm.

As described above, the monitoring apparatus 10 according to the first embodiment has two operation modes: "alarm mode" in which the monitoring apparatus 10 issues an alarm when the temperature measured by the non-contact temperature sensor exceeds a reference value; and "non-alarm mode" in which the monitoring apparatus 10 issues no alarm even when the temperature measured by the non-contact temperature sensor exceeds the reference value. Then, if the amount of temperature change per unit time when the measured temperature rises exceeds a predetermined threshold, the monitoring apparatus 10 changes the operation mode from alarm mode to non-alarm mode. It is thus possible to prevent the occurrence of false alarms when, for example, even though the surface temperature of the monitored object does not rise, the temperature measured by the non-contact temperature sensor exceeds the upper limit temperature as a result of entry of a person into the space between the non-contact temperature sensor and the monitored object.

In the monitoring apparatus 10 of the first embodiment, non-alarm mode is continued for the predetermined time period T1 after the operation mode is changed from alarm mode to non-alarm mode. Therefore, for example, even when a person who has entered the space between the non-contact temperature sensor and the monitored object stays there for maintenance operation, the occurrence of false alarms during the operation can be prevented by setting the predetermined time period T1 longer than the duration of the operation.

If the measured temperature abruptly rises again when the operation mode is non-alarm mode, the monitoring apparatus 10 of the first embodiment extends the duration of non-alarm mode. Therefore, for example, even when the maintenance operation continues longer than the duration of non-alarm mode (T1) initially defined, non-alarm mode is not cancelled during the operation and the occurrence of false alarms can be prevented.

Of the temperatures in the region corresponding to the monitored rack 50, the maximum temperature 601 (see FIG. 8) most abruptly changes when a person enters the space between the temperature sensor 4 and the rack 50. The monitoring apparatus 10 of the first embodiment calculates the amount of change in maximum temperature 601 per unit time. This enhances the accuracy of detecting the entry of a person, and thus further reduces the possibility of occurrence of false alarms.

When the operation mode is switched to non-alarm mode, the monitoring apparatus 10 of the first embodiment outputs information indicating that no alarm is issued. This allows the user to recognize that the monitoring apparatus 10 is in a state of issuing no alarm.

Second Embodiment (Configuration of Monitoring Apparatus 10A of Second Embodiment)

Figure 14:
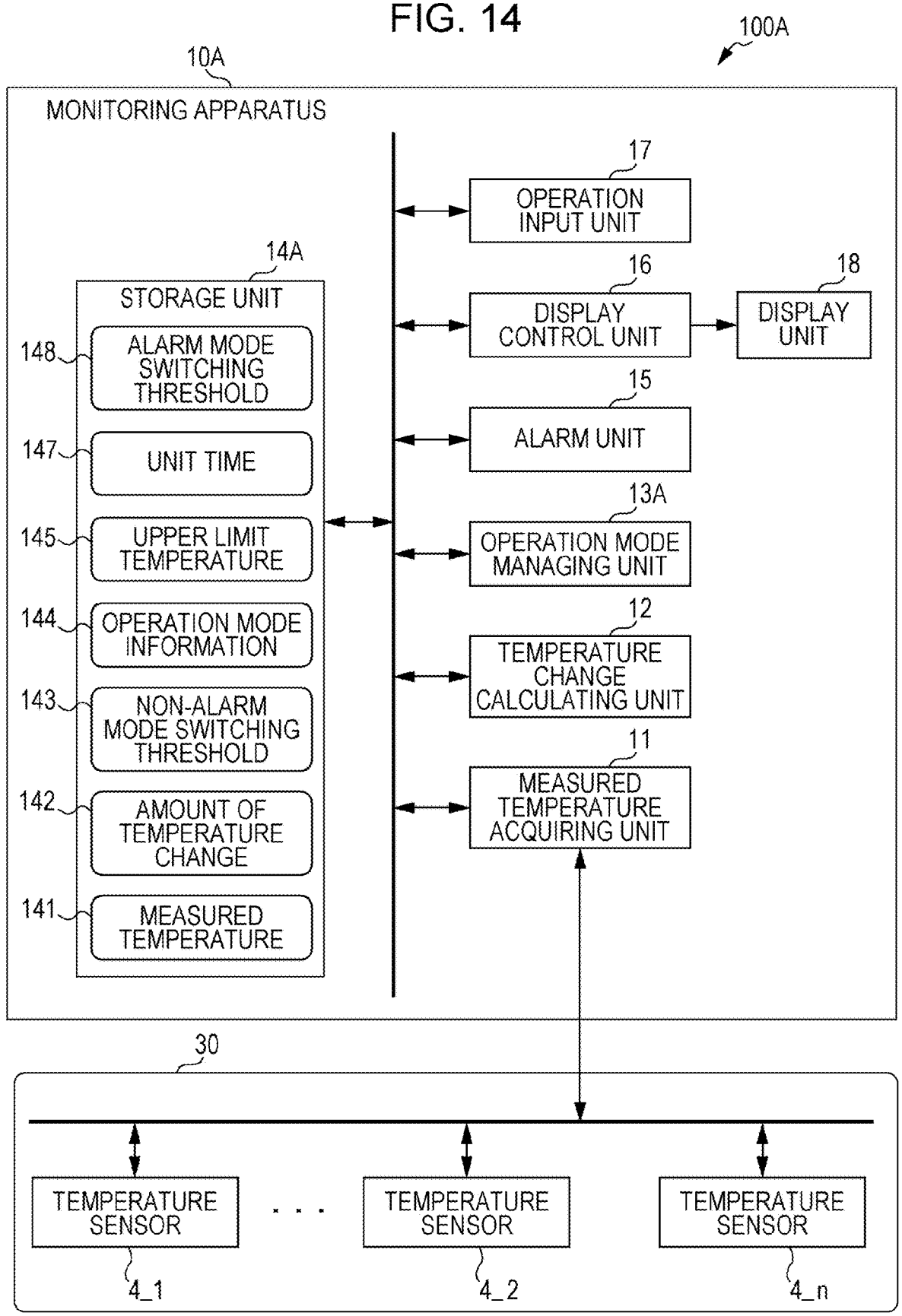
FIG. 14 illustrates a configuration of a monitoring apparatus according to a second embodiment.

FIG. 14 illustrates a configuration of a monitoring apparatus 10A according to a second embodiment.

The monitoring apparatus 10A of a temperature monitoring system 100A illustrated in FIG. 14 differs from the monitoring apparatus 10 of the first embodiment in that the monitoring apparatus 10A switches the operation mode from non-alarm mode to alarm mode when, in non-alarm mode, the temperature drops to the same degree as the temperature rise which causes switching from alarm mode to non-alarm mode.

Specifically, if the amount of temperature change 142 per unit time when the measured temperature rises, the amount of temperature change 142 being calculated by the temperature change calculating unit 12, exceeds the non-alarm mode switching threshold 143, an operation mode managing unit 13A in the monitoring apparatus 10A sets the operation mode information 144 in the storage unit 14 to "non-alarm mode", like the operation mode managing unit 13 of the first embodiment.

Also, if the amount of temperature change 142 per unit time when the measured temperature drops, the amount of temperature change 142 being calculated by the temperature change calculating unit 12, exceeds a predetermined threshold, the operation mode managing unit 13A switches the operation mode information 144 in the storage unit 14 from "non-alarm mode" to "alarm mode".

The predetermined threshold described above is a value that defines a reference value for the amount of temperature drop per unit time. Hereinafter, the predetermined threshold is referred to as "alarm mode switching threshold 148". The alarm mode switching threshold 148 is stored in the storage unit 14.

The alarm mode switching threshold 148 may be any value whose absolute value is substantially equal to that of the non-alarm mode switching threshold 143 (e.g., within ±10% of the absolute value of the non-alarm mode switching threshold 143). The value of the alarm mode switching threshold 148 may be capable of being rewritten as in the case of the non-alarm mode switching threshold 143.

Figure 15:
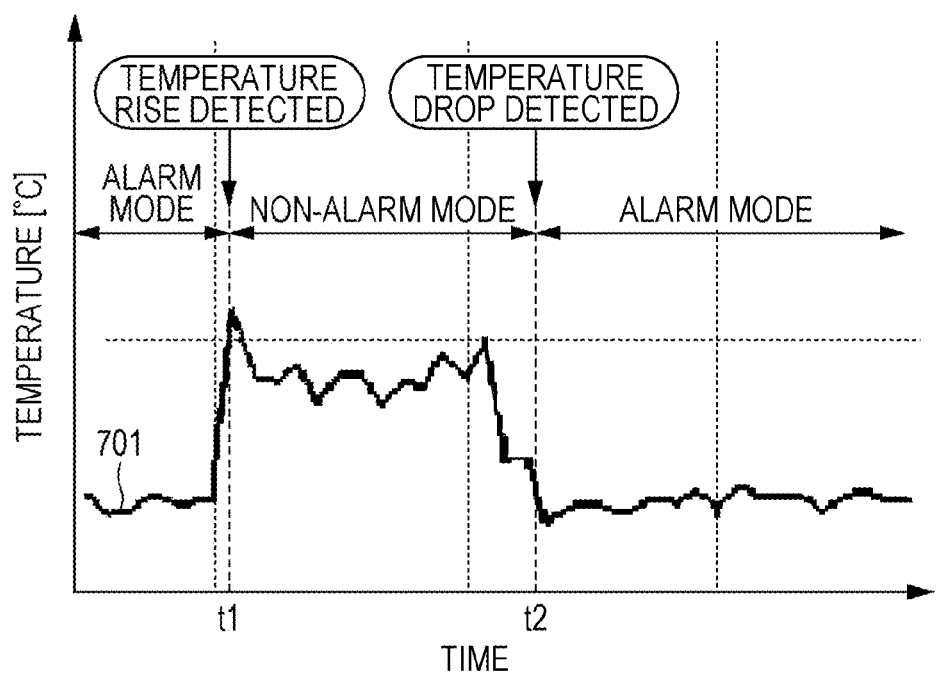
FIG. 15 is a diagram for explaining an operation mode switching process performed by the monitoring apparatus according to the second embodiment.

FIG. 15 is a diagram for explaining an operation mode switching process performed by the monitoring apparatus 10A according to the second embodiment.

In FIG. 15, the horizontal axis represents time and the vertical axis represents temperature. A curve denoted by reference numeral 701 in FIG. 15 indicates how the surface temperature (maximum temperature) of a given rack 50 changes with time.

For example, in the initial state after the monitoring apparatus 10A is turned on, the operation mode information 144 in the storage unit 14 is "alarm mode". Then if, as illustrated in FIG. 15, the amount of temperature change 142 per unit time when the measured temperature of the rack 50 rises, the amount of temperature change 142 being calculated by the temperature change calculating unit 12, exceeds the non-alarm mode switching threshold 143 at time t1, the operation mode managing unit 13A changes the operation mode information 144 in the storage unit 14 from "alarm mode" to "non-alarm mode".

Then if, at time t2 in FIG. 15, the amount of temperature change 142 per unit time when the measured temperature of the rack 50 drops, the amount of temperature change 142 being calculated by the temperature change calculating unit 12, exceeds the alarm mode switching threshold 148, the operation mode managing unit 13A changes the operation mode information 144 in the storage unit 14 from "non-alarm mode" to "alarm mode".

(Flow of Monitoring Process Performed by Monitoring Apparatus 10A of Second Embodiment)

A method for how the monitoring apparatus 10A of the second embodiment monitors the surface temperature of each rack row 5 will now be described in detail.

A monitoring process performed by the monitoring apparatus 10A of the second embodiment differs from the monitoring process performed by the monitoring apparatus 10 of the first embodiment in the operation mode switching process (step S3) illustrated in FIG. 10, but is otherwise the same as the monitoring process performed by the monitoring apparatus 10 of the first embodiment.

Only the difference from the monitoring method performed by the monitoring apparatus 10 of the first embodiment will be described here.

Figure 16:
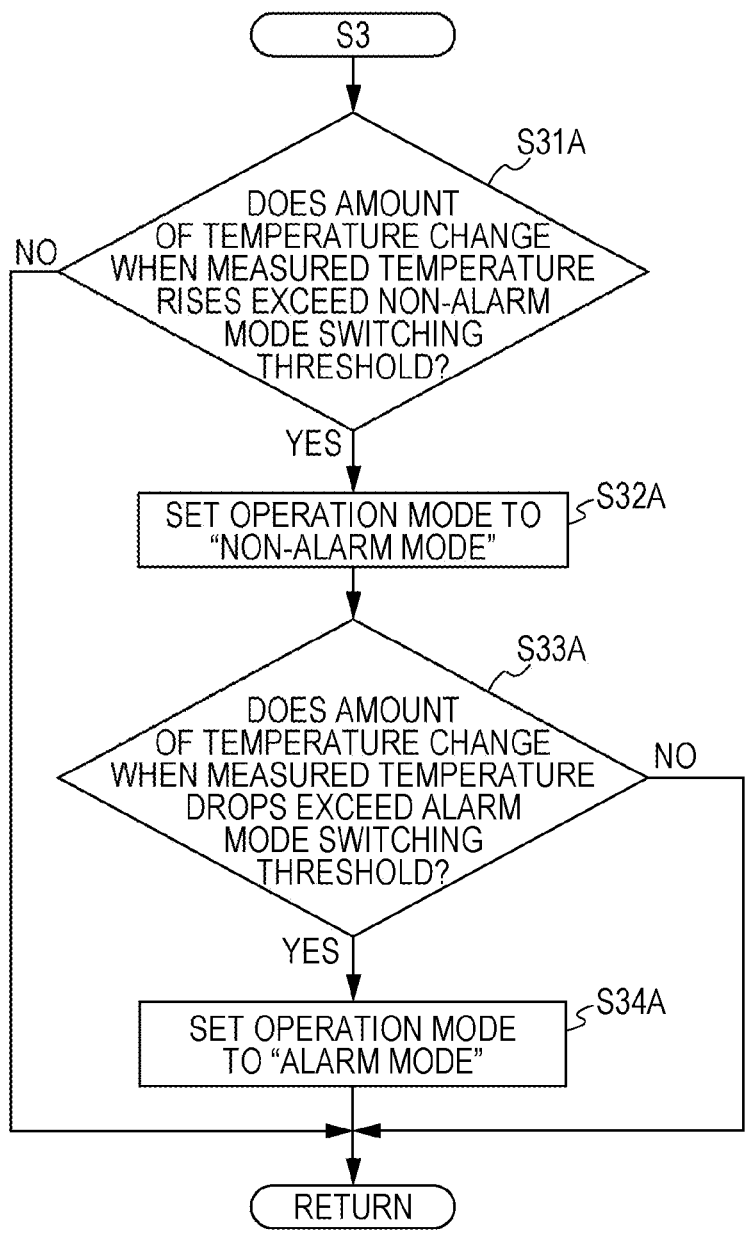
FIG. 16 illustrates a flow of the operation mode switching process performed by the monitoring apparatus according to the second embodiment.

FIG. 16 illustrates a flow of an operation mode switching process performed by the monitoring apparatus 10A of the second embodiment.

In the operation mode switching process, first, the operation mode managing unit 13A in the monitoring apparatus 10A determines whether the amount of temperature change 142 when the measured temperature of each rack 50 rises, the amount of temperature change 142 being stored in the storage unit 14, exceeds the non-alarm mode switching threshold 143 (S31A). If the amount of temperature change 142 does not exceed the non-alarm mode switching threshold 143 in step S31A, the operation mode managing unit 13A does not change the operation mode information 144, which is "alarm mode", in the storage unit 14.

On the other hand, if the amount of temperature change 142 when the measured temperature rises exceeds the non-alarm mode switching threshold 143 in step S31A, the operation mode managing unit 13A switches the operation mode information 144 stored in the storage unit 14 from "alarm mode" to "non-alarm mode" (S32A). At the same time, the alarm unit 15 may display, in the display unit 18, information indicating that the monitoring apparatus 10A is in non-alarm mode.

Next, the operation mode managing unit 13A determines whether the amount of temperature change 142 when the measured temperature of the rack 50 drops, the amount of temperature change 142 being stored in the storage unit 14, exceeds the alarm mode switching threshold 148 (S33A). If the amount of temperature change 142 when the measured temperature drops does not exceed the alarm mode switching threshold 148 in step S33A, the operation mode managing unit 13A maintains "non-alarm mode", and the process proceeds to step S4.

On the other hand, if the amount of temperature change 142 when the measured temperature drops exceeds the alarm mode switching threshold 148 in step S33A, the operation mode managing unit 13A switches the operation mode information 144 stored in the storage unit 14 from "non-alarm mode" to "alarm mode" (S34A).

(Advantageous Effect of Monitoring Apparatus 10A of Second Embodiment)

Like the monitoring apparatus 10 of the first embodiment, the monitoring apparatus 10A of the second embodiment can prevent the occurrence of false alarms when the temperature measured by the non-contact temperature sensor exceeds the upper limit temperature as a result of entry of a person into the space between the non-contact temperature sensor and the monitored object.

The monitoring apparatus 10A of the second embodiment switches the operation mode from non-alarm mode to alarm mode when the temperature drops to the same degree as the temperature rise which causes switching from alarm mode to non-alarm mode. The monitoring apparatus 10A can thus quickly resume monitoring of the surface temperature of the rack 50. This is particularly effective when, for example, a person passes between the non-contact temperature sensor and the monitored object and does not stay there for a long time.

Third Embodiment (Configuration of Monitoring Apparatus 10B of Third Embodiment)

Figure 17:
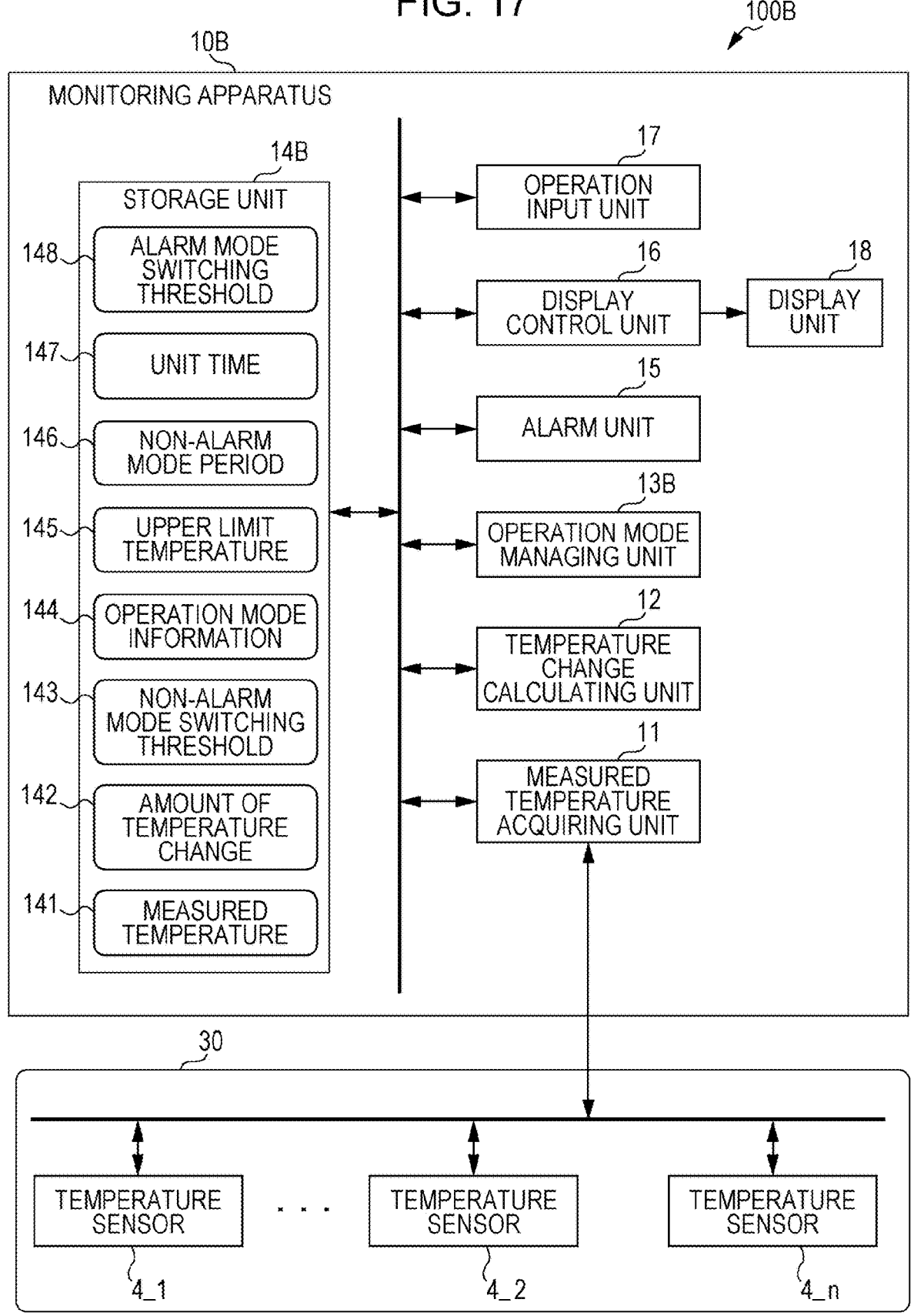
FIG. 17 illustrates a configuration of a monitoring apparatus according to a third embodiment.

FIG. 17 illustrates a configuration of a monitoring apparatus 10B according to a third embodiment.

The monitoring apparatus 10B of a temperature monitoring system 100E illustrated in FIG. 17 differs from the monitoring apparatus 10 of the first embodiment in that the monitoring apparatus 10B switches the operation mode from non-alarm mode to alarm mode when, before the predetermined time period T1 elapses after switching from alarm mode to non-alarm mode, the temperature drops to the same degree as the temperature rise which causes switching from alarm mode to non-alarm mode.

Specifically, if the amount of temperature change 142 per unit time when the measured temperature rises, the amount of temperature change 142 being calculated by the temperature change calculating unit 12, exceeds the non-alarm mode switching threshold 143, an operation mode managing unit 13B in the monitoring apparatus 10B sets the operation mode information 144 in the storage unit 14 to "non-alarm mode", like the operation mode managing unit 13 of the first embodiment.

Also, when the predetermined time period T1 elapses after changing the operation mode information 144 to "non-alarm mode", the operation mode managing unit 13B changes the operation mode information 144 again from "non-alarm mode" to "alarm mode".

Also, if, before the predetermined time period T1 elapses, the amount of temperature change 142 per unit time when the measured temperature drops, the amount of temperature change 142 being calculated by the temperature change calculating unit 12, exceeds the alarm mode switching threshold 148, the operation mode managing unit 13B switches the operation mode information 144 in the storage unit 14 from "non-alarm mode" to "alarm mode".

Figure 18:
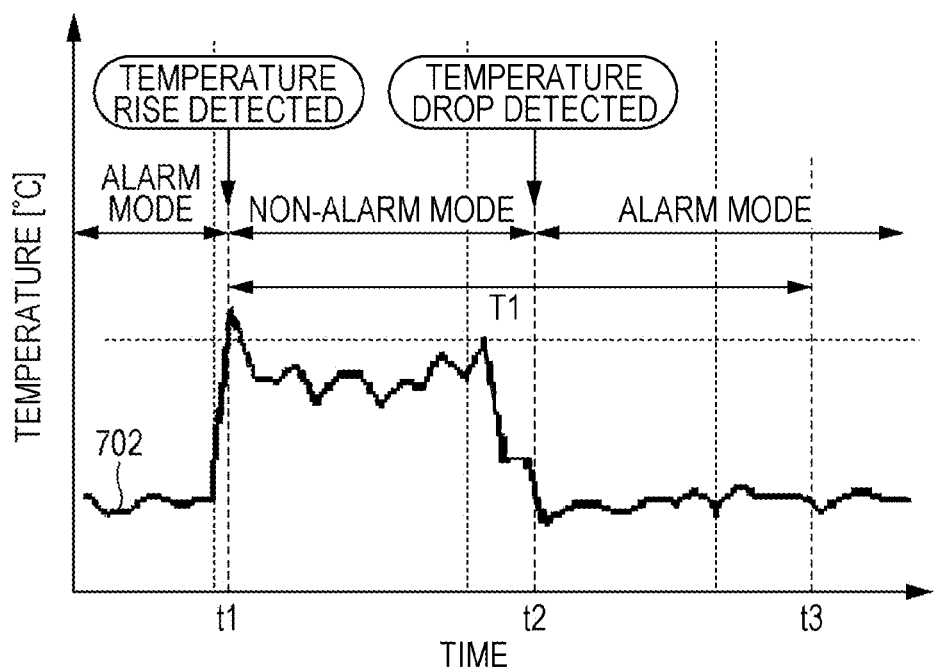
FIG. 18 is a diagram for explaining an operation mode switching process performed by the monitoring apparatus according to the third embodiment.

FIG. 18 is a diagram for explaining an operation mode switching process performed by the monitoring apparatus 10B according to the third embodiment.

In FIG. 18, the horizontal axis represents time and the vertical axis represents temperature. A curve denoted by reference numeral 702 in FIG. 18 indicates how the surface temperature (maximum temperature) of a given rack 50 changes with time.

For example, in the initial state after the monitoring apparatus 10B is turned on, the operation mode information 144 in the storage unit 14 is "alarm mode". Then if, as illustrated in FIG. 18, the amount of temperature change 142 per unit time when the measured temperature of the rack 50 rises, the amount of temperature change 142 being calculated by the temperature change calculating unit 12, exceeds the non-alarm mode switching threshold 143 at time t1, the operation mode managing unit 13B changes the operation mode information 144 in the storage unit 14 from "alarm mode" to "non-alarm mode".

At this point, the operation mode managing unit 13B sets, for example on a timer (not shown) in the information processing apparatus forming the monitoring apparatus 10B, a value (T1) based on the non-alarm mode period 146 stored in the storage unit 14, and causes the timer to start timing.

Then if, at time t2 before the predetermined time period T1 elapses, the amount of temperature change 142 per unit time when the measured temperature of the rack 50 drops, the amount of temperature change 142 being calculated by the temperature change calculating unit 12, exceeds the alarm mode switching threshold 148, the operation mode managing unit 13B changes the operation mode information 144 in the storage unit 14 from "non-alarm mode" to "alarm mode".

If a temperature drop exceeding the alarm mode switching threshold 148 is not detected at time t2, the operation mode managing unit 13B changes the operation mode information 144 in the storage unit 14 from "non-alarm mode" to "alarm mode" at subsequent time t3 when receiving from the timer a notification indicating that the predetermined time period T1 has elapsed.

If a temperature rise exceeding the non-alarm mode switching threshold 143 is detected again before the predetermined time period T1 elapses after switching the operation mode information 144 from "alarm mode" to "non-alarm mode", the operation mode managing unit 13B extends the duration of non-alarm mode, like the operation mode managing unit 13 of the first embodiment described above.

(Flow of Monitoring Process Performed by Monitoring Apparatus 10B of Third Embodiment)

A method for how the monitoring apparatus 10B of the third embodiment monitors the surface temperature of each rack row 5 will now be described in detail.

A monitoring process performed by the monitoring apparatus 10B of the third embodiment differs from the monitoring process performed by the monitoring apparatus 10 of the first embodiment in the operation mode switching process (step S3) illustrated in FIG. 10, but is otherwise the same as the monitoring process performed by the monitoring apparatus 10 of the first embodiment.

Only the difference from the monitoring method performed by the monitoring apparatus 10 of the first embodiment will be described here.

Figure 19:
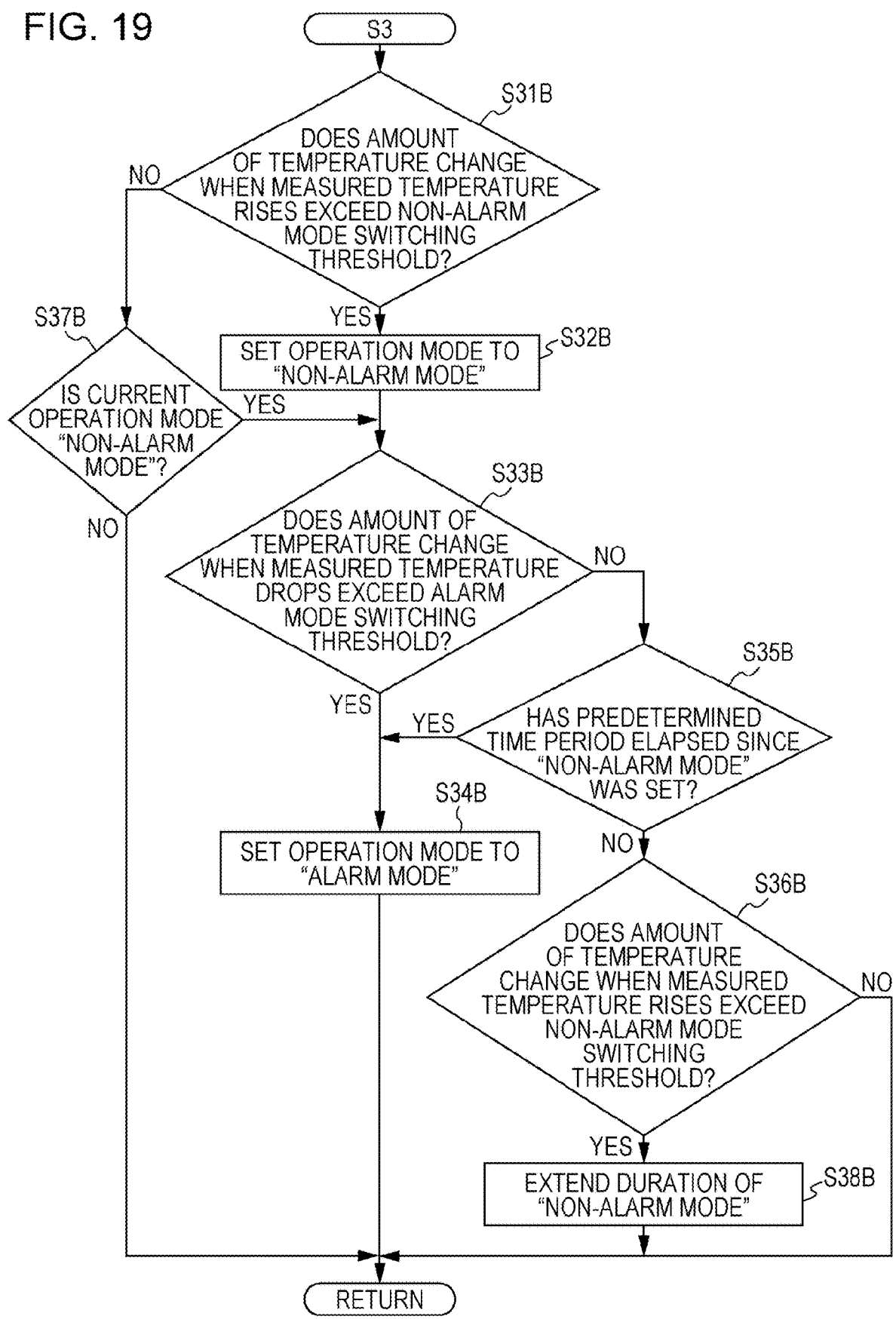
FIG. 19 illustrates a flow of the operation mode switching process performed by the monitoring apparatus according to the third embodiment.

FIG. 19 illustrates a flow of an operation mode switching process performed by the monitoring apparatus 10B of the third embodiment.

In the operation mode switching process, first, the operation mode managing unit 13B in the monitoring apparatus 10B determines whether the amount of temperature change 142 when the measured temperature of each rack 50 rises, the amount of temperature change 142 being stored in the storage unit 14, exceeds the non-alarm mode switching threshold 143 (S31B). If the amount of temperature change 142 does not exceed the non-alarm mode switching threshold 143 in step S31B, the operation mode managing unit 13B determines whether the current operation mode is "non-alarm mode" (S37B). If the current operation mode is "alarm mode", not "non-alarm mode", in step S37B, the operation mode managing unit 13B does not change the operation mode information 144 in the storage unit 14, and the process proceeds to step S4.

If the amount of temperature change 142 when the measured temperature rises exceeds the non-alarm mode switching threshold 143 in step S31B, the operation mode managing unit 13B switches the operation mode information 144 stored in the storage unit 14 from "alarm mode" to "non-alarm mode" (S32B). At this point, with the same technique as that for the operation mode managing unit 13, the operation mode managing unit 13B starts counting the duration T1 of non-alarm mode. At the same time, the alarm unit 15 may display, in the display unit 18, information indicating that the monitoring apparatus 10B is in non-alarm mode.

When setting the operation mode to "non-alarm mode" in step S32B, or determining that the current operation mode is "non-alarm mode" in step S37B, the operation mode managing unit 13B determines whether the amount of temperature change 142 when the measured temperature of the rack 50 drops, the amount of temperature change 142 being stored in the storage unit 14, exceeds the alarm mode switching threshold 148 (S33B). If the amount of temperature change 142 when the measured temperature drops exceeds the alarm mode switching threshold 148 in step S33B, the operation mode managing unit 13B switches the operation mode information 144 stored in the storage unit 14 from "non-alarm mode" to "alarm mode" (S34B).

On the other hand, if the amount of temperature change 142 when the measured temperature drops does not exceed the alarm mode switching threshold 148 in step S33B, the operation mode managing unit 13B determines whether the predetermined time period T1 has elapsed since "non-alarm mode" was set (S35B). If the predetermined time period T1 has elapsed in step S35B, the operation mode managing unit 13B switches the operation mode information 144 stored in the storage unit 14 from "non-alarm mode" to "alarm mode" (S34B).

On the other hand, if the predetermined time period T1 has not elapsed in step S35B, the operation mode managing unit 13B determines whether the amount of temperature change 142 when the measured temperature rises exceeds the non-alarm mode switching threshold 143 (S36B).

If the amount of temperature change 142 does not exceed the non-alarm mode switching threshold 143 in step S36B, the process proceeds to step S4. On the other hand, if the amount of temperature change 142 exceeds the non-alarm mode switching threshold 143 in step S36B, the operation mode managing unit 13B extends the duration of non-alarm mode using the same technique as that for the operation mode managing unit 13 of the first embodiment (S38B). Then, the process proceeds to step S4.

(Advantageous Effect of Monitoring Apparatus 10B of Third Embodiment)

Like the monitoring apparatus 10 of the first embodiment, the monitoring apparatus 10B of the third embodiment can prevent the occurrence of false alarms when the temperature measured by the non-contact temperature sensor exceeds the upper limit temperature as a result of entry of a person into the space between the non-contact temperature sensor and the monitored object.

Like the monitoring apparatus 10A of the second embodiment, the monitoring apparatus 10B of the third embodiment switches the operation mode from non-alarm mode to alarm mode when, even before the elapse of the predetermined time period T1, the temperature drops to the same degree as the temperature rise which causes switching from alarm mode to non-alarm mode. The monitoring apparatus 10B can thus quickly resume monitoring of the surface temperature of the rack 50.

After switching from alarm mode to non-alarm mode, even if a temperature drop exceeding the alarm mode switching threshold 148 cannot be detected for some reason, the monitoring apparatus 10B of the third embodiment can return the operation mode from non-alarm mode to alarm mode after the elapse of the predetermined time period T1. It is thus possible to stably control the switching of the operation mode.

The present inventions made by the present inventors have been described in detail on the basis of the embodiments thereof. However, the present disclosure is not limited to the embodiments described above, and it will be understood that the present disclosure can be variously modified without departing from the spirit thereof.

For example, in the embodiments described above, the monitoring apparatus 10, 10A, or 10B is applied to a system that monitors, with non-contact temperature sensors, the surface temperatures of racks that house ICT devices in a data center or server room. As in the case of the embodiments described above, applying the monitoring apparatus 10, 10A, or 10B to any system can reduce the occurrence of false alarms, as long as there is a possibility in the system that an object (e.g., person) which is not monitored may enter the space between the non-contact temperature sensor and the monitored object.

What is claimed is:
1. A monitoring apparatus, comprising:
processing circuitry configured to
acquire, from a non-contact temperature sensor, a measured temperature on a surface of a rack housing an information and communication technology device, calculate an amount of change per unit time in the measured temperature, change an operation mode from an alarm mode to a non-alarm mode when the calculated amount of change per unit time in the measured temperature exceeds a first threshold, output an alarm when in the alarm mode and the acquired measured temperature exceeds a reference value, not output the alarm when in the non-alarm mode and the acquired measured temperature exceeds the reference value, and not output the alarm for a predetermined time period that starts when the amount of change per unit time in the measured temperature exceeds the first threshold.

2. The monitoring apparatus according to claim 1, wherein the processing circuitry is further configured to change the operation mode from the non-alarm mode to the alarm mode when the predetermined time period elapses after changing the operation mode from the alarm mode to the non-alarm mode.

3. The monitoring apparatus according to claim 2, wherein the processing circuitry is further configured to extend the duration of the non-alarm mode when, before the predetermined time period elapses after changing the operation mode to the non-alarm mode, the calculated amount of change per unit time, when the measured temperature rises, exceeds the first threshold.

4. The monitoring apparatus according to claim 2, wherein the processing circuitry is further configured to change the operation mode from the non-alarm mode to the alarm mode when, before the predetermined time period elapses after changing the operation mode to the non-alarm mode, the calculated amount of change per unit time, when the measured temperature drops, exceeds a second threshold.

5. The monitoring apparatus according to claim 1, wherein the processing circuitry is further configured to change the operation mode from the non-alarm mode to the alarm mode when the calculated amount of change per unit time, when the measured temperature drops, exceeds a second threshold.

6. The monitoring apparatus according to claim 1, wherein when the operation mode is the non-alarm mode, the processing circuitry is further configured to output information indicating that no alarm is issued.

7. A temperature monitoring method using an information processing apparatus and issuing an alarm when a surface temperature of a rack measured by a non-contact temperature sensor exceeds a reference value, the monitoring method comprising:

acquiring, by the information processing apparatus, a measured temperature measured by the non-contact temperature sensor;

calculating, by the information processing apparatus, an amount of change per unit time in measured temperature based on the acquired measured temperature;

setting, by the information processing apparatus, an operation mode of the information processing apparatus to an alarm mode when the calculated amount of change per unit time, when the measured temperature rises, does not exceed a first threshold, and setting, by the information processing apparatus, the operation mode to a non-alarm mode when the calculated amount of change per unit time, when the measured temperature rises, exceeds the first threshold; and issuing, by the information processing apparatus, an alarm when the operation mode is the alarm mode when the acquired measured temperature exceeds the reference value, and not issuing the alarm when the operation mode is the non-alarm mode, even when the measured temperature exceeds the reference value.

8. The monitoring method according to claim 7, wherein the setting step includes changing, by the information processing apparatus, the operation mode from the alarm mode to the non-alarm mode when the amount of change per unit time, when the measured temperature rises, exceeds the first threshold; and returning, by the information processing apparatus, the operation mode from the non-alarm mode to the alarm mode, when a predetermined time period elapses after changing the operation mode to the non-alarm mode.

9. The monitoring method according to claim 8, wherein the setting step includes extending, by the information processing apparatus, a duration of the non-alarm mode when, before the predetermined time period elapses after changing the operation mode to the non-alarm mode, the amount of change per unit time, when the measured temperature rises, exceeds the first threshold.

10. The monitoring method according to claim 8, wherein the setting step includes returning, by the information processing apparatus, the operation mode from the non-alarm mode to the alarm mode when, before the predetermined time period elapses after changing the operation mode to the non-alarm mode, the amount of change per unit time, when the measured temperature drops, exceeds a second threshold.

11. The monitoring method according to claim 7, wherein the setting step includes changing, by the information processing apparatus, the operation mode from the alarm mode to the non-alarm mode when the calculated amount of change per unit time, when the measured temperature rises, exceeds the first threshold; and returning, by the information processing apparatus, the operation mode from the non-alarm mode to the alarm mode when the amount of change per unit time, when the measured temperature drops, exceeds the second threshold.

12. The monitoring method according to claim 7, further comprising outputting, by the information processing apparatus, information when the operation mode is the non-alarm mode, the information indicating that no alarm is issued.

13. A non-transitory computer-readable medium storing a program that when executed, causes processing circuitry of the information processing apparatus to execute each of the steps in the temperature monitoring method according to claim 7.

* * * * *